United States Patent
Kim et al.

(10) Patent No.: US 10,347,323 B2
(45) Date of Patent: Jul. 9, 2019

(54) SEMICONDUCTOR MEMORY DEVICES, MEMORY SYSTEMS INCLUDING SEMICONDUCTOR MEMORY DEVICES, AND OPERATING METHODS OF SEMICONDUCTOR MEMORY DEVICES

(71) Applicant: Samsung Electronics Co., Ltd., Suwon-si, Gyeonggi-do (KR)

(72) Inventors: Young-Hun Kim, Seoul (KR); Sihong Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/985,200

(22) Filed: May 21, 2018

(65) Prior Publication Data

US 2019/0130950 A1    May 2, 2019

(30) Foreign Application Priority Data

Oct. 26, 2017  (KR) .................. 10-2017-0140363

(51) Int. Cl.
    *G11C 11/40*     (2006.01)
    *G11C 11/4093*   (2006.01)
    *G11C 7/10*      (2006.01)
    *G11C 11/4091*   (2006.01)
    *G11C 7/22*      (2006.01)

(52) U.S. Cl.
    CPC ........ *G11C 11/4093* (2013.01); *G11C 7/1066* (2013.01); *G11C 7/222* (2013.01); *G11C 11/4091* (2013.01)

(58) Field of Classification Search
    CPC . G11C 11/4093; G11C 11/4091; G11C 7/222; G11C 7/1066
    See application file for complete search history.

(56) References Cited

U.S. PATENT DOCUMENTS

| | | | |
|---|---|---|---|
| 5,095,485 A * | 3/1992 | Sato ................. | G06F 11/10 712/42 |
| 5,367,526 A * | 11/1994 | Kong ................. | G06F 11/1032 714/801 |
| 6,052,818 A * | 4/2000 | Dell ................. | G06F 11/10 714/763 |
| 7,123,456 B2 | 10/2006 | Kamata et al. | |
| 7,373,564 B2 * | 5/2008 | Kikutake ............ | G11C 29/10 365/201 |
| 7,415,569 B2 | 8/2008 | Dietrich et al. | |

(Continued)

*Primary Examiner* — Vanthu T Nguyen
(74) *Attorney, Agent, or Firm* — Myers Bigel, P.A.

(57) ABSTRACT

A semiconductor memory device includes a memory core that performs reading and writing of data, data delivery and training blocks that are connected between first pads and the memory core, and at least one data delivery, clock generation and training block that is connected between at least one second pad and the memory core. In a first training operation, the data delivery and training blocks output first training data, received through the first pads, through the first pads as second training data. In a second training operation, at least one of the data delivery and training blocks outputs third training data, received through the at least one second pad, through at least one of the first pads as fourth training data. The second training data and the fourth training data are output in synchronization with read data strobe signals output through the at least one second pad.

20 Claims, 35 Drawing Sheets

(56) References Cited

U.S. PATENT DOCUMENTS

| | | | | |
|---|---|---|---|---|
| 8,055,930 B2* | 11/2011 | Bae | ............................ | G06F 1/12 |
| | | | | 327/144 |
| 8,207,976 B2* | 6/2012 | Hein | ..................... | G11C 7/1051 |
| | | | | 327/158 |
| 8,248,873 B2 | 8/2012 | Bae et al. | | |
| 8,437,216 B2* | 5/2013 | Oh | ........................ | G11C 7/1087 |
| | | | | 365/185.28 |
| 9,208,330 B2 | 12/2015 | Srinivasan et al. | | |
| 9,646,675 B1 | 5/2017 | Lee | | |
| 9,767,920 B2* | 9/2017 | Kim | ......................... | G11C 29/42 |
| 10,163,485 B2* | 12/2018 | Chen | ..................... | G11C 11/406 |
| 2011/0314190 A1 | 12/2011 | Tanaka | | |
| 2016/0026436 A1 | 1/2016 | Shen | | |
| 2017/0331493 A1* | 11/2017 | Yu | ......................... | H03M 13/098 |

* cited by examiner

FIG. 9

| Command | CK_t | CS | CA0 | CA1 | CA2 | CA3 | CA4 | CA5 | CA6 |
|---|---|---|---|---|---|---|---|---|---|
| WR_FIFO with 1st option | R | H | L | L | L | L | L | H | H |
| | F | X | L | V | V | V | V | V | V |
| WR_FIFO with 2nd option | R | H | L | L | L | L | L | H | H |
| | F | X | H | V | V | V | V | V | V |

FIG. 12

| CK_t | CS | CA0 | CA1 | CA2 | CA3 | CA4 | CA5 | CA6 |
|------|----|----|----|----|----|----|----|----|
| R | H | L | L | L | L | L | H | L |
| F | X | V | V | V | V | V | V | V |

FIG. 20

| CK_t | CS | CA0 | CA1 | CA2 | CA3 | CA4 | CA5 | CA6 |
|---|---|---|---|---|---|---|---|---|
| R | H | L | L | L | L | L | H | L |
| F | X | V | V | V | V | V | V | V |

FIG. 21

| Command | CK_t | CS | CA0 | CA1 | CA2 | CA3 | CA4 | CA5 | CA6 |
|---|---|---|---|---|---|---|---|---|---|
| RD_FIFO with 1st option | R | H | L | L | L | L | L | H | H |
| | F | X | L | V | V | V | V | V | V |
| RD_FIFO with 2nd option | R | H | L | L | L | L | L | H | L |
| | F | X | H | V | V | V | V | V | V |

SEMICONDUCTOR MEMORY DEVICES, MEMORY SYSTEMS INCLUDING SEMICONDUCTOR MEMORY DEVICES, AND OPERATING METHODS OF SEMICONDUCTOR MEMORY DEVICES

CROSS-REFERENCE TO RELATED APPLICATION

This application claims priority under 35 U.S.C. § 119 to Korean Patent Application No. 10-2017-0140363 filed Oct. 26, 2017, in the Korean Intellectual Property Office, the entire contents of which are incorporated by reference herein.

BACKGROUND

Embodiments of the inventive concepts described herein relate to semiconductor memory devices, also referred to herein as semiconductor memory, and more particularly, relate to semiconductor memory, memory systems including the semiconductor memory, and operating methods of the semiconductor memory.

Semiconductor memory devices are used in various electronic devices. The semiconductor memory devices may be used to store data used for the electronic devices to operate. Also, the semiconductor memory may be used to load codes, which the electronic devices may execute, such as an operating system, firmware, software, and the like.

As the quality of content used in the electronic devices is improved, there is an increasing demand for the performance of the semiconductor memory. For example, there is an increasing demand for an increase in the speed and reliability of the semiconductor memory. To satisfy the demand, a variety of new functions for the semiconductor memory have been developed and adopted.

Some of the new functions may use one or more pads that may be used for the semiconductor memory to communicate with a controller. If new pads are used for some functions, the number of pads to be used for the semiconductor memory may increase. If the number of pads increases, the size of the semiconductor memory may increase, and thus, manufacturing costs of the semiconductor memory may increase.

SUMMARY

Embodiments of the inventive concepts provide semiconductor memory with improved reliability without an increase in the number of pads, memory systems including the semiconductor memory, and operating methods of the semiconductor memory.

According to an example embodiment of the inventive concepts, a semiconductor memory device includes a memory core that performs reading and writing of data, data delivery and training blocks that are connected between first pads and the memory core, and at least one data delivery, clock generation and training block that is connected between at least one second pad and the memory core. In a first training operation, the data delivery and training blocks output first training data, which are received through the first pads, through the first pads as second training data. In a second training operation, at least one of the data delivery and training blocks outputs third training data, which are received through the at least one second pad, through at least one of the first pads as fourth training data. The second training data and the fourth training data are output in synchronization with read data strobe signals output through the at least one second pad.

According to an example embodiment of the inventive concepts, a memory system includes a semiconductor memory, and a controller configured to control the semiconductor memory. The semiconductor memory and the controller communicate with each other through data input and output lines, data mask inversion lines, and read data strobe lines. In a first training operation, the controller transmits first data to the semiconductor memory through the data input and output lines and the data mask inversion lines, and reads the first data from the semiconductor memory through the data input and output lines and the data mask inversion lines. In a second training operation, the controller transmits second data to the semiconductor memory through the read data strobe lines and reads the second data from the semiconductor memory through at least two of the data input and output lines and the data mask inversion lines.

According to an example embodiment of the inventive concepts, a semiconductor memory device includes a memory core that performs reading and writing of data, a first data delivery and training block that are connected between a first pad and the memory core, a second data delivery and training block that are connected between a second pad and the memory core, and a data delivery, clock generation and training block that is connected between a third pad and the memory core. In a training input operation, the first and second data delivery and training blocks receive first and second training data through the first pad and the second pad, respectively, and the data delivery, clock generation and training block receives third training data through the third pad. In a training output operation, the first data delivery and training block outputs the first training data through the first pad, and the second data delivery and training block combines the second and third training data to generate fourth training data and outputs the fourth training data through the second pad.

BRIEF DESCRIPTION OF THE FIGURES

The above and other objects and features of the inventive concepts will become apparent by describing in detail example embodiments thereof with reference to the accompanying drawings.

FIG. 9 illustrates an example of command and address signals of a FIFO register write command.

FIG. 12 illustrates an example of command and address signals of a FIFO register read command.

FIG. 20 illustrates an example of command and address signals of a FIFO register write command.

FIG. 21 illustrates an example of command and address signals of a FIFO register read command.

DETAILED DESCRIPTION

Below, embodiments of the inventive concepts may be described in detail and clearly to such an extent that one of ordinary skill in the art may implement embodiments of the inventive concepts.

Figure 1:
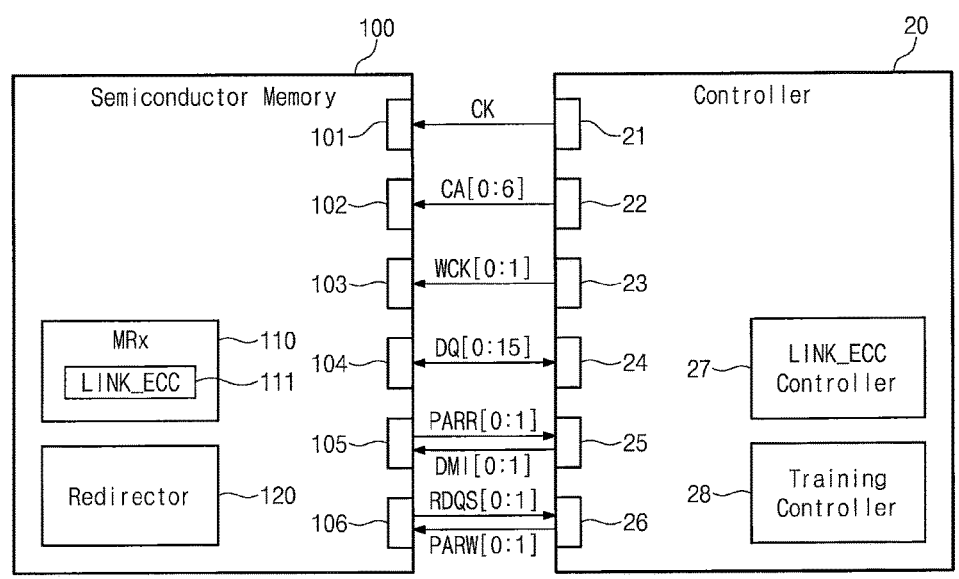
FIG. 1 is a block diagram illustrating a memory system according to embodiments of the inventive concepts.

FIG. 1 is a block diagram illustrating a memory system 10 according to embodiments of the inventive concepts. Referring to FIG. 1, the memory system 10 may include a controller 20 and a semiconductor memory device 100, also referred to herein as semiconductor memory 100. For example, the semiconductor memory 100 may include a dynamic random access memory (DRAM), a synchronous DRAM (SDRAM), a double date rate SDRAM (DDR SDRAM), and low power DDR SDRAM (LPDDR SDRAM).

The controller 20 may communicate with the semiconductor memory 100 through first to sixth controller pads 21 to 26. The semiconductor memory 100 may communicate with the controller 20 through first to sixth memory pads 101 to 106. As described herein, individual ones of the second to sixth controller pads 22 to 26 and the second to sixth memory pads 102 to 106 may respectively include more than one pad (e.g., a pad of FIG. 1 may represent a collection of pads). The first controller pad 21 may be connected with the first memory pad 101. The controller 20 may supply a clock signal CK to the semiconductor memory 100 through the first controller pad 21. The clock signal CK may be toggled periodically between a low level and a high level. In some embodiments, a pad (e.g., first to sixth controller pads 21 to 26 and/or first to sixth memory pads 101 to 106) may refer to a conductive region of the semiconductor memory 100 that may be used for attaching signal-transmitting elements of the semiconductor memory 100.

The second controller pad 22 may be connected with the second memory pad 102. For example, the second controller pad 22 may include 7 controller pads. The second memory pad 102 may include 7 memory pads respectively connected to the 7 controller pads. The controller 20 may provide a command and address signals CA[0:6] to the semiconductor memory 100 through the second controller pad 22.

The third controller pad 23 may be connected with the third memory pad 103. For example, the third controller pad 23 may include 2 controller pads. The third memory pad 103 may include 2 memory pads respectively connected to the 2 controller pads. The controller 20 may provide write clock signals WCK[0:1] to the semiconductor memory 100 through the third controller pad 23.

The write clock signals WCK[0:1] may be toggled periodically between the high level and the low level. The controller 20 may supply the write clock signals WCK[0:1] to the semiconductor memory 100 upon reading data from the semiconductor memory 100 or writing data in the semiconductor memory 100.

The fourth controller pad 24 may be connected with the fourth memory pad 104. For example, the fourth controller pad 24 may include 16 controller pads. The fourth memory pad 104 may include 16 memory pads respectively connected to the 16 controller pads. The controller 20 and the semiconductor memory 100 may exchange data signals DQ[0:15] with each other through the fourth controller pad 24 and the fourth memory pad 104.

The fifth controller pad 25 may be connected with the fifth memory pad 105. For example, the fifth controller pad 25 may include 2 controller pads. The fifth memory pad 105 may include 2 memory pads respectively connected to the 2 controller pads. The controller 20 may provide data mask inversion signals DMI[0:1] to the semiconductor memory 100 through the fifth controller pad 25. The semiconductor memory 100 may provide read parity signals PARR[0:1] to the controller 20 through the fifth controller pad 25.

The sixth controller pad 26 may be connected with the sixth memory pad 106. For example, the sixth controller pad 26 may include 2 controller pads. The sixth memory pad 106 may include 2 memory pads respectively connected to the 2 controller pads. The controller 20 may provide write parity signals PARW[0:1] to the semiconductor memory 100 through the sixth controller pad 26. The semiconductor memory 100 may provide read data strobe signals RDQS[0:1] to the controller 20 through the sixth controller pad 26.

The semiconductor memory 100 includes a mode register (MRx) 110 and a redirector 120. The mode register 110 may store various information used in the operation of the semiconductor memory 100. The mode register 110 may be programmed by the controller 20.

The redirector 120 may operate under control of the controller 20 in training. For example, in training, the redirector 120 may output a signal received through at least one pad through at least another pad. An example in which the redirector 120 redirects the input and output of signals will be more fully described below.

The controller 20 includes a link error correction code (ECC) controller 27. The link error correction code controller 27 may determine whether to apply an error correction code to communication between the controller 20 and the semiconductor memory 100. In the case of applying the error correction code, the controller 20 may transmit the write parity signals PARW[0:1] to the semiconductor memory 100 through the sixth controller pad 26 during a write operation.

The link error correction code controller 27 may generate the write parity signals PARW[0:1] by applying one of various error correction codes such as a cyclic redundancy code (CRC), a hamming code, and Bose-Chaudhri-Hocquenghem (BCH) code to the data signals DQ[0:15].

The write parity signals PARW[0:1] may be generated from the data signals DQ[0:15]. For example, each of the write parity signals PARW[0:1] may correspond to 8 data signals. The semiconductor memory 100 may correct an error of the data signals DQ[0:15] based on the write parity signals PARW[0:1] and the data signals DQ[0:15].

In the case of applying the error correction code, the semiconductor memory 100 may transmit the read parity signals PARR[0:1] to the controller 20 through the fifth controller pad 25 during a read operation. The read parity signals PARR[0:1] may be generated by applying an error correction code to the data signals DQ[0:15]. The controller 20 may correct an error of the data signals DQ[0:15] based on the read parity signals PARR[0:1] and the data signals DQ[0:15].

In the case of not applying the error correction code, the controller 20 may not transmit the write parity signals PARW[0:1] during a write operation. Also, the semiconductor memory 100 may not transmit the read parity signals PARR[0:1] during a read operation. For example, the link error correction code controller 27 may adjust whether to apply an error correction code by adjusting a link error correction code configuration (LINK_ECC) 111 of the mode register 110 in the semiconductor memory 100.

In some embodiments, the read parity signals PARR[0:1] and the write parity signals PARW[0:1] may be for correcting an error occurring during communication between the controller 20 and the semiconductor memory 100. The read parity signals PARR[0:1] and the write parity signals PARW[0:1] may be distinguished from a storage parity in that they are not stored in a memory array 130 (refer to FIG. 3) of the semiconductor memory 100.

The write parity signals PARW[0:1] may be for correcting an error occurring when the controller 20 transmits the data signals DQ[0:15] to the semiconductor memory 100. The read parity signals PARR[0:1] may be for correcting an error occurring when the semiconductor memory 100 transmits the data signals DQ[0:15] to the controller 20.

In contrast, the storage parity may be for correcting an error occurring while the data signals DQ[0:15] are stored in the semiconductor memory 100. The storage parity that is included as a part of the data signals DQ[0:15] may be written in the memory array 130 of the semiconductor memory 100 and may be read from the memory array 130 of the semiconductor memory 100.

A training controller 28 may control training between the controller 20 and the semiconductor memory 100. For example, the training may include write training to adjust timings between the write clock signals WCK[0:1] and the data signals DQ[0:15] during a write operation, and read training to adjust timings between the read data strobe signals RDQS[0:1] and the data signals DQ[0:15] during a read operation.

The write training may be performed by transmitting preset pattern signals to the semiconductor memory 100 and again receiving the transmitted signals from the semiconductor memory 100. For example, the write training may be performed with respect to signals exchanged between the controller 20 and the semiconductor memory 100 in synchronization with the write clock signals WCK[0:1] or the read data strobe signals RDQS[0:1].

For example, the controller 20 may transmit pattern signals to the semiconductor memory 100 through the fourth and fifth controller pads 24 and 25 connected to the fourth and fifth memory pads 104 and 105 in synchronization with the write clock signals WCK[0:1]. For example, the pattern signals may be transmitted as the data signals DQ[0:15] and the data mask inversion signals DMI[0:1].

The controller 20 may receive pattern signals from the semiconductor memory 100 through the fourth and fifth controller pads 24 and 25 connected to the fourth and fifth memory pads 104 and 105 in synchronization with the read data strobe signals RDQS[0:1]. For example, the pattern signals may be received as the data signals DQ[0:15] and the read parity signals PARR[0:1] from the semiconductor memory 100.

Write training may be performed on signals exchanged through the fourth and fifth controller pads 24 and 25 by writing and reading pattern signals through the fourth and fifth controller pads 24 and 25. For example, write training may be performed on transmission timings of the data signals DQ[0:15], the data mask inversion signals DMI[0:1], and/or the read parity signals PARR[0:1].

In the case where the link error correction code controller 27 activates application of an error correction code, the controller 20 may further transmit the write parity signals PARW[0:1] to the semiconductor memory 100 in synchronization with the write clock signals WCK[0:1]. Accordingly, in the case where the application of the error correction code is activated, there is a need to perform write training on the sixth controller pad 26 connected to the sixth memory pad 106 through which the controller 20 and the semiconductor memory 100 exchange the write parity signals PARW[0:1].

For write training associated with the write parity signals PARW[0:1], the controller 20 may transmit pattern signals to the semiconductor memory 100 through the sixth controller pad 26 connected to the sixth memory pad 106. For example, the pattern signals may be transmitted to the semiconductor memory 100 as the write parity signals PARW[0:1].

However, even though the controller 20 intends to read pattern signals from the semiconductor memory 100 through the sixth controller pad 26 connected to the sixth memory pad 106, the semiconductor memory 100 may be specified to transmit the read data strobe signals RDQS[0:1] through the sixth memory pad 106 connected to the sixth controller pad 26. Accordingly, the controller 20 cannot receive pattern signals from the semiconductor memory 100 through the sixth controller pad 26 connected to the sixth memory pad 106.

The semiconductor memory 100 includes the redirector 120 for the purpose of performing write training on the sixth controller pad 26 connected to the sixth memory pad 106. The training controller 28 may control the redirector 120 to receive pattern signals, which are transmitted to the semiconductor memory 100 through the sixth controller pad 26 connected to the sixth memory pad 106, through a different memory pad or controller pad. Accordingly, write training may be performed on the write parity signals PARW[0:1] in addition to the data signals DQ[0:15] and the data mask inversion signals DMI[0:1].

Kinds of pads and the number of pads are described concretely in FIG. 1. However, kinds of pads and the number of pads described in FIG. 1 are examples and do not limit the technical ideas of the inventive concepts. Pads that are not illustrated in FIG. 1 may be included in the memory system 10, and a part of pads illustrated in FIG. 1 may be removed from the memory system 10. Also, the number of pads illustrated in FIG. 1 may be variously changed.

Figure 2:
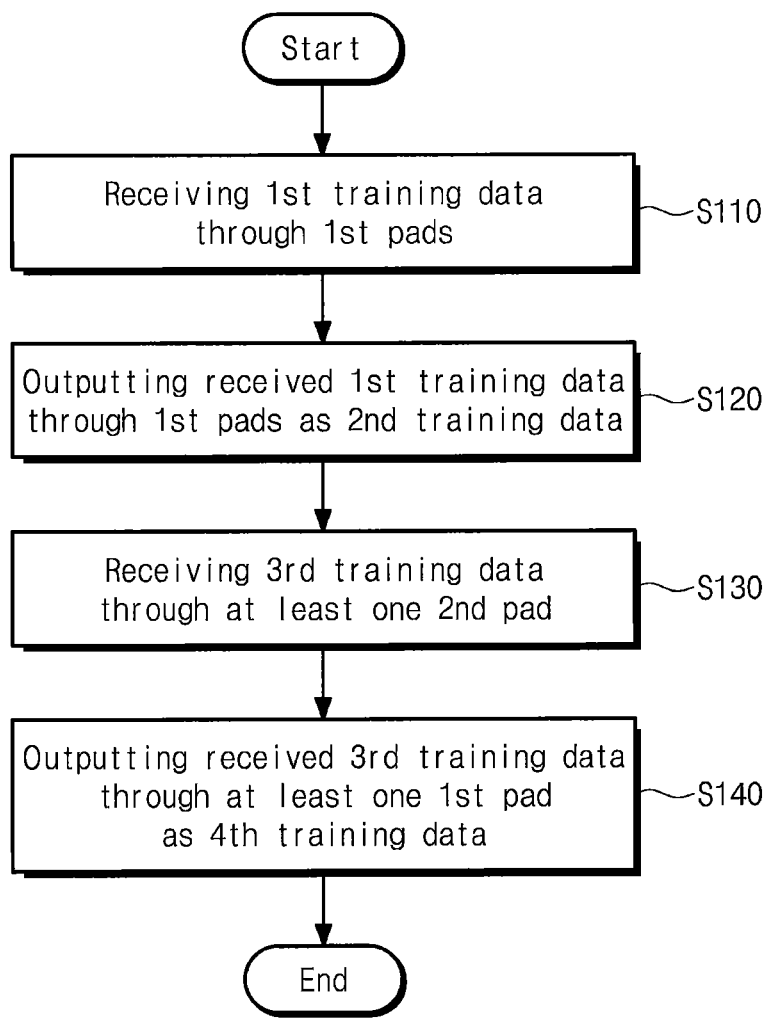
FIG. 2 is a flowchart illustrating an operating method of a semiconductor memory according to embodiments of the inventive concepts.

FIG. 2 is a flowchart illustrating an operating method of the semiconductor memory 100 according to embodiments of the inventive concepts. For example, an example of an operating method of the semiconductor memory 100 in write training is illustrated in FIG. 2. Referring to FIGS. 1 and 2, in operation S110, the semiconductor memory 100 may receive first training data from the controller 20 through first pads. For example, the first pads may include the fourth memory pad 104 and the fifth memory pad 105.

For example, the first training data may be received as the data signals DQ[0:15] and the data mask inversion signals DMI[0:1]. The first training data may include pattern signals having a pattern for write training. The controller 20 may output preset pattern signals as the first training data to the semiconductor memory 100.

The first training data may be received in synchronization with the write clock signals WCK[0:1]. If a difference between toggle timings of the write clock signals WCK[0:1] and transmission timings of training data received through one pad of the first pads is within a threshold value (e.g., belongs to a normal receive range), training data transmitted through the corresponding pad may be received normally in the semiconductor memory 100.

If a difference between the toggle timings of the write clock signals WCK[0:1] and transmission timings of training data received through another pad of the first pads is out of the threshold value (e.g., does not belong to the normal receive range), training data transmitted through the corresponding pad may not be received normally in the semiconductor memory 100. For example, the training data may be received as erroneous values.

In operation S120, the semiconductor memory 100 may output the received first training data to the controller 20 through the first pads as second training data. The second training data may include values that are the same as and different from the first training data depending on transmission timings of the first training data and toggle timings of the write clock signals WCK[0:1] that the controller 20 transmits.

The first pads may include the fourth memory pad 104 and the fifth memory pad 105. The second training data may be output in synchronization with the read data strobe signals RDQS[0:1]. For example, it is assumed that read training is completed before write training. That is, it is assumed that a difference between toggle timings of the read data strobe signals RDQS[0:1] output from the semiconductor memory 100 and transmission timings of the first training data is within a threshold value.

The controller 20 may compare the second training data received from the semiconductor memory 100 with the first training data that the controller 20 transmits. If the second training data and the first training data are matched, it may be determined that a difference between toggle timings of the write clock signals WCK[0:1] and transmission timings of the first training data is within the threshold value. If the second training data and the first training data are not matched, it may be determined that a difference between toggle timings of the write clock signals WCK[0:1] and transmission timings of at least a part of the first training data is out of the threshold value.

The controller 20 may detect a difference between toggle timings of the write clock signals WCK[0:1] and transmission timings of the first training data while sweeping toggle timings of the write clock signals WCK[0:1] and transmission timings of the first training data. The controller 20 may adjust transmission timings through the first pads, for example, transmission timings of the data signals DQ[0:15] and the data mask inversion signals DMI[0:1] depending on the detected difference.

In operation S130, the semiconductor memory 100 may receive third training data from the controller 20 through at least one second pad. For example, the at least one second pad may include the sixth memory pad 106. The third training data may be received as the write parity signals PARW[0:1]. The third training data may be received in synchronization with the write clock signals WCK[0:1].

If a difference between toggle timings of the write clock signals WCK[0:1] and transmission timings of training data received through the at least one second pad is within the threshold value (e.g., belongs to a normal receive range), training data transmitted through the corresponding pad may be received normally in the semiconductor memory 100.

If a difference between toggle timings of the write clock signals WCK[0:1] and transmission timings of training data received through the at least one second pad is out of the threshold value (e.g., does not belong to a normal receive range), training data transmitted through the corresponding pad may not be received normally in the semiconductor memory 100. For example, the training data may be received as erroneous values.

In operation S140, the semiconductor memory 100 may output the received third training data to the controller 20 through the at least one first pad as fourth training data. The at least one first pad may be at least one of the first pads mentioned above. For example, the at least one first pad may include at least one of the fourth memory pad 104 and the fifth memory pad 105.

The fourth training data may be output in synchronization with the read data strobe signals RDQS[0:1] transmitted through the at least one second pad. The controller 20 may compare the fourth training data received from the semiconductor memory 100 with the third training data that the controller 20 transmits.

The controller 20 may detect a difference between toggle timings of the write clock signals WCK[0:1] and transmission timings of the third training data while sweeping toggle timings of the write clock signals WCK[0:1] and transmission timings of the third training data. The controller 20 may adjust transmission timings through the at least one second pad, for example, transmission timings of the write parity signals PARW[0:1] depending on the detected difference.

As described above, the fourth memory pad 104 and the fifth memory pad 105 may be used for communication of data (or communication of additional information/data associated with the communication of data) between the semiconductor memory 100 and the controller 20 and are free from the input (or receive) and output of data. Accordingly, training of the fourth memory pad 104 and/or the fifth memory pad 105 may be performed by receiving (or input) (operation S110) and transmission (or output) (operation S120) of training data.

The sixth memory pad 106 may be used for communication of data (or communication of additional information/data associated with the communication of data) between the semiconductor memory 100 and the controller 20, and is free to input (or receive) and output data but is not used to transmit (or output) data. Accordingly, training of the sixth memory pad 106 may be performed by receiving (or input) (operation S130) of training data and transmission (or output) (operation S140) of the training data through another pad (e.g., at least one of the first pads).

Write training associated with the sixth memory pad 106 which is not used to output data may be possible by outputting received (or input) data to another pad through redirecting. Accordingly, the reliability of the semiconductor memory 100 and the memory system 10 including the semiconductor memory 100 may be improved.

Also, as the read data strobe signals RDQS[0:1] and the write parity signals PARW[0:1] uses the sixth memory pad 106 in common, the number of pads of the semiconductor memory 100 may be prevented from increasing, and an increase in manufacturing costs of the semiconductor memory 100 may be reduced and/or suppressed.

Figure 3:
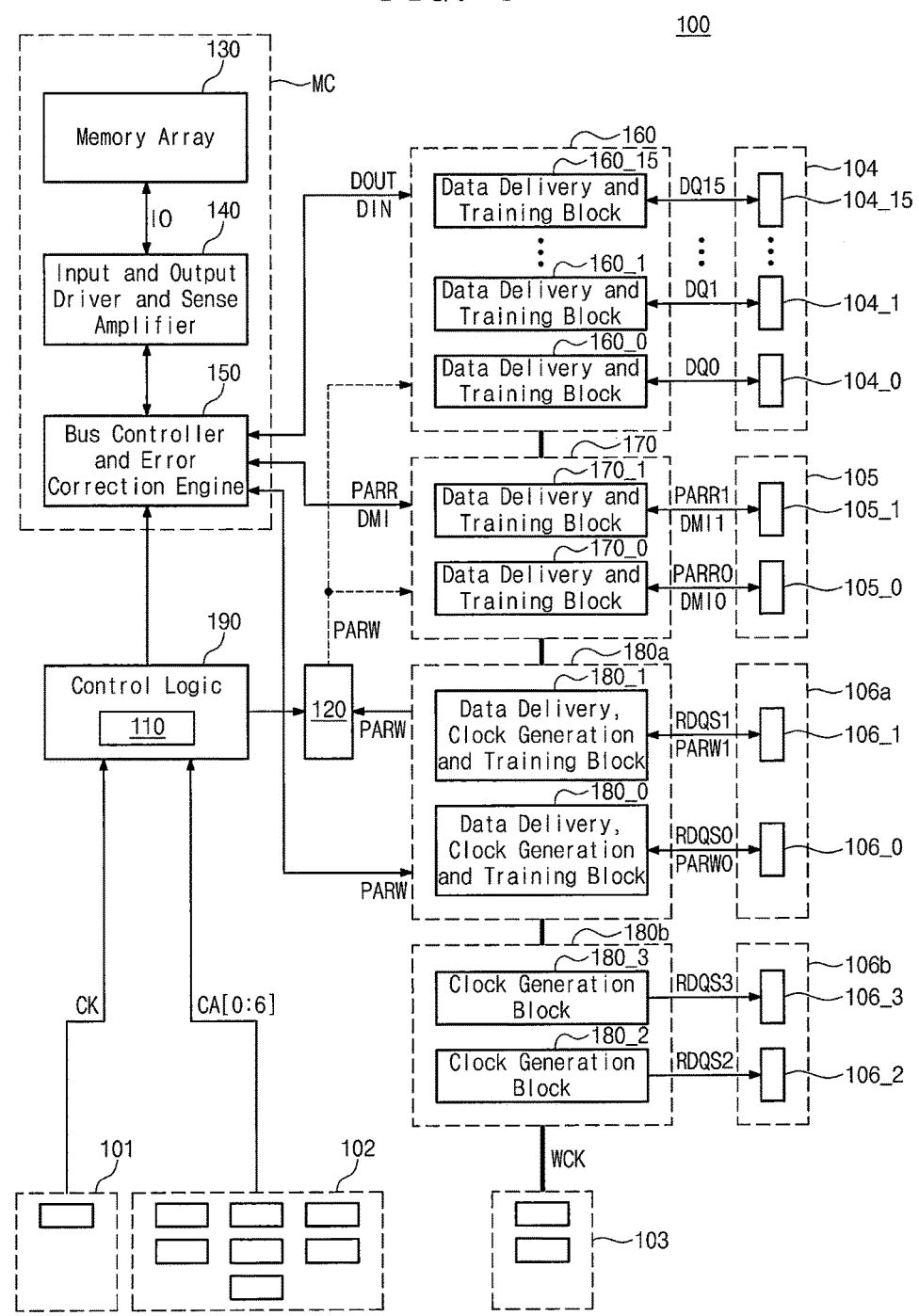
FIG. 3 is a block diagram illustrating a semiconductor memory device according to embodiments of the inventive concepts.

FIG. 3 is a block diagram illustrating the semiconductor memory 100 according to embodiments of the inventive concepts. Referring to FIGS. 1 and 3, the semiconductor memory 100 includes the redirector 120, the memory array 130, an input and output driver and sense amplifier 140, a bus controller and error correction engine 150, a first block 160, a second block 170, a third block 180a, a fourth block 180b, and control logic 190.

The memory array 130 includes memory cells. The memory cells may be arranged in a matrix form or may be stacked in a three-dimensional structure. The memory array 130 is connected to the input and output driver and sense amplifier 140 through input and output lines IO. The input and output driver and sense amplifier 140 may perform read and write operations on the memory cells of the memory array 130.

The bus controller and error correction engine 150 may be connected with the first block 160, the second block 170, and the third block 180a. The bus controller and error correction engine 150 may receive input data DIN from the first block 160 and may transmit the received input data DIN to the input and output driver and sense amplifier 140.

The bus controller and error correction engine 150 may receive output data DOUT from the input and output driver and sense amplifier 140 and may transmit the received output data DOUT to the first block 160. The bus controller and error correction engine 150 may receive the data mask inversion signal DMI from the second block 170.

The data mask inversion signal DMI may indicate whether an inversion of data or a write mask of data is to be used. The data mask inversion signal DMI may be set by programming the mode register 110. When the data mask inversion signal DMI indicates data mask, the bus controller and error correction engine 150 may not transmit the input data DIN to the input and output driver and sense amplifier 140.

When the data mask inversion signal DMI indicates inversion, the bus controller and error correction engine 150 may invert the input data DIN or may transmit the data mask inversion signal DMI to the input and output driver and sense amplifier 140 together with the input data DIN.

In a read operation, the bus controller and error correction engine 150 may generate a read parity PARR based on the output data DOUT. The bus controller and error correction engine 150 may transmit the read parity PARR to the second block 170.

In a write operation, the bus controller and error correction engine 150 may receive a write parity PARW from the third block 180a. The bus controller and error correction engine 150 may perform error correction based on the write parity PARW and the input data DIN. The memory array 130, the input and output driver and sense amplifier 140, and the bus controller and error correction engine 150 may constitute a memory core MC of the semiconductor memory 100.

The control logic 190 may receive clock signals CK through the first memory pad 101. The control logic 190 may receive the command and address signals CA[0:6] through the second memory pads 102. For example, the control logic 190 may receive the command and address signals CA[0:6] in synchronization with the clock signals CK.

The control logic 190 may control operations of the memory core MC, the redirector 120, the first and second blocks 160 and 170, the third block 180a, and the fourth block 180b in response to the command and address signals CA[0:6].

In some embodiments, the mode register 110 is illustrated as being included in the control logic 190. However, the mode register 110 is not limited as being included in the control logic 190. The mode register 110 may be provided outside the control logic 190 or may be included inside any other component, not the control logic 190.

The first block 160 may include first data delivery and training blocks 160_1 to 160_15 that operate in synchronization with the write clock signals WCK[0:1]. The first data delivery and training blocks 160_1 to 160_15 may be respectively connected to fourth memory pads 104_0 to 104_15. The first data delivery and training blocks 160_1 to 160_15 may exchange the data signals DQ[0:15] with the fourth memory pads 104_0 to 104_15, respectively.

In a write operation, the first block 160 may transmit the data signals DQ0 to DQ15 as the input data DIN to the memory core MC. In a read operation, the first block 160 may output the output data DOUT transmitted from the memory core MC as the data signals DQ0 to DQ15.

In a write operation of write training, the first data delivery and training blocks 160_1 to 160_15 may receive and store training data from the fourth memory pads 104_0 to 104_15, respectively. In a read operation of write training, the first data delivery and training blocks 160_1 to 160_15 may output the stored training data to the fourth memory pads 104_0 to 104_15, respectively.

The second block 170 may include second data delivery and training blocks 170_0 and 170_1 that operate in synchronization with the write clock signals WCK[0:1]. The second data delivery and training blocks 170_0 and 170_1 may be respectively connected to fifth memory pads 105_0 and 105_1.

The second data delivery and training blocks 170_0 and 170_1 may transmit the read parity signals PARR0 and PARR1 to the fifth memory pads 105_0 and 105_1 and may receive the data mask inversion signals DMI0 and DMI1 from the fifth memory pads 105_0 and 105_1.

In a write operation, the second block 170 may transmit the data mask inversion signals DMI0 and DMI1 as the data mask inversion signal information DMI to the memory core MC. In a read operation, the second block 170 may output a read parity PARR transmitted from the memory core MC as the read parity signals PARR0 and PARR1.

In a write operation of write training, the second data delivery and training blocks 170_0 and 170_1 may receive and store training data from the fifth memory pads 105_0 and 105_1, respectively. In a read operation of write training, the second data delivery and training blocks 170_0 and 170_1 may output the stored training data to the fifth memory pads 105_0 and 105_1, respectively.

The third block 180a may include data delivery, clock generation and training blocks 180_0 and 180_1 that operate in synchronization with the write clock signals WCK[0:1]. The fourth block 180b may include clock generation blocks 180_2 and 180_3 that operate in synchronization with the write clock signals WCK[0:1].

The blocks 180_0 to 180_3 may be respectively connected to sixth memory pads 106_0 to 106_3. The data delivery, clock generation and training blocks 180_0 and 180_1 may receive the write parity signals PARW0 and PARW1 from the sixth memory pads 106_0 and 106_1 and may transmit the read data strobe signals RDQS0 and RDQS1 to the sixth memory pads 106_0 and 106_1.

The clock generation blocks 180_2 and 180_3 may transmit the read data strobe signals RDQS2 and RDQS3 to the sixth memory pads 106_2 and 106_3. Compared with FIG. 1, the sixth memory pads 106_2 and 106_3 may be further included which do not transmit the write parity signals PARW0 and PARW1 and transmit only the read data strobe signals RDQS2 and RDQS3.

In a write operation, the third block 180a may transmit the write parity signals PARW0 and PARW1 as a write parity PARW to the memory core MC. In a read operation, the third block 180a may generate and output the read data strobe signals RDQS0 and RDQS1 from the write clock signals WCK[0:1]. In a read operation, the fourth block 180b may generate and output the read data strobe signals RDQS2 and RDQS3 from the write clock signals WCK[0:1].

The redirector 120 may support the data delivery, clock generation and training blocks 180_0 and 180_1 of the third block 180a. For example, in a write operation of write training, the redirector 120 may allow training data received from the sixth memory pads 106_0 and 106_1 to be redirected to and stored in the first block 160 or the second block 170.

As another example, in a read operation of write training, the redirector 120 may allow training data stored in the third block 180a to be output through at least one pad of the fourth memory pads 104_0 to 104_15 or the fifth memory pads 105_0 and 105_1. That is, the redirector 120 may allow training data received through the sixth memory pads 106_0 and 106_1 to be output to other memory pads, for example, the fourth memory pads 104_0 to 104_15 or the fifth memory pads 105_0 and 105_1.

In FIG. 3, for convenience of description, the redirector 120 is illustrated as a block existing outside the first, second, and third blocks 160, 170, and 180a. However, the redirector 120 may be distributed to and positioned in the first, second, and/or third blocks 160, 170, and 180a. That is, the redirector 120 may be included in at least one of the first, second, and third blocks 160, 170, and 180a.

Figure 4A:
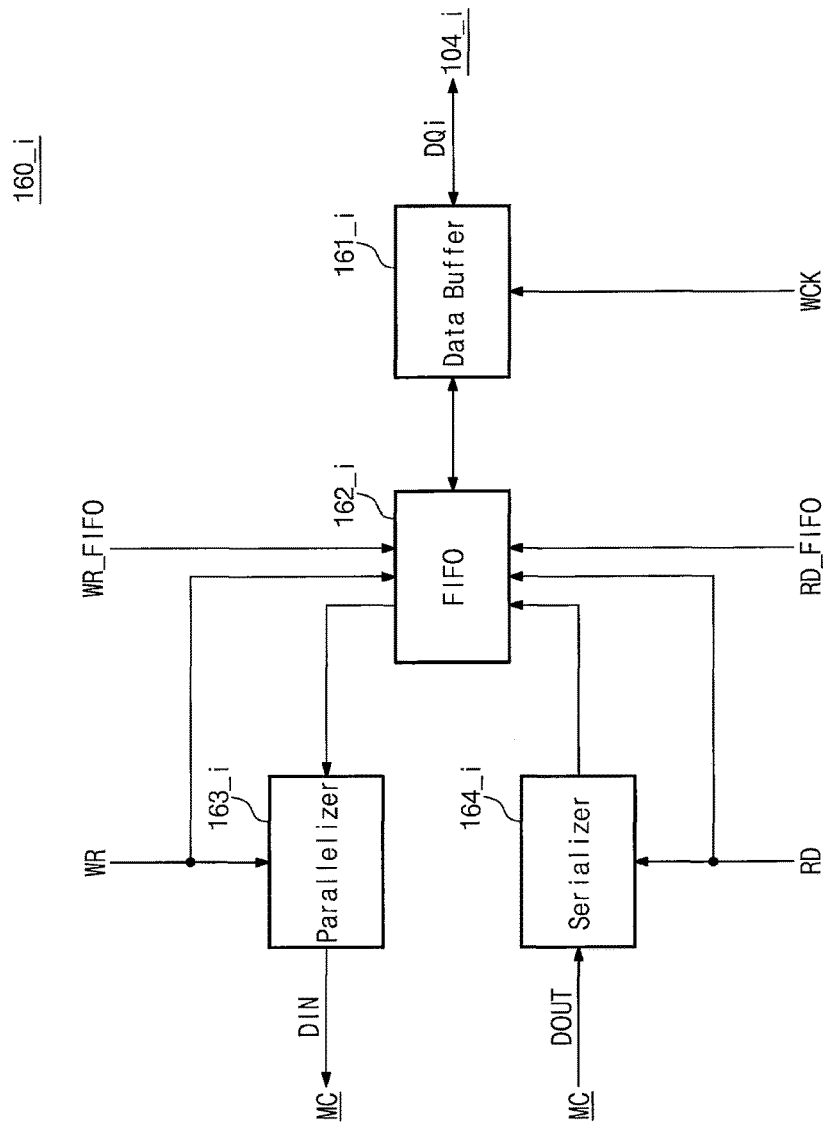
FIG. 4A illustrates an example of one of first data delivery and training blocks according to embodiments of the inventive concepts.

FIG. 4A illustrates an example of one of the first data delivery and training blocks 160_0 to 160_15 according to embodiments of the inventive concepts. In some embodiments, an example of a first data delivery and training block 160_i that is not associated with the redirector 120 is illustrated in FIG. 4A. Referring to FIGS. 3 and 4A, the first data delivery and training block 160_i includes a data buffer 161_i, a first-in first-out (FIFO) register 162_i, a parallelizer 163_i, and a serializer 164_i.

The data buffer 161_i may temporarily store data (e.g., a data signal DQi or training data) transmitted from the FIFO register 162_i and may transmit the stored data to the fourth memory pad 104_i. The data buffer 161_i may temporarily store data (e.g., a data signal DQi or training data) received from the fourth memory pad 104_i and may transmit the stored data to the FIFO register 162_i. The data buffer 161_i may operate in synchronization with one WCK of the write clock signals WCK[0:1].

The FIFO register 162_i may compensate for a speed difference between a relatively high-speed data buffer 161_i and a relatively low-speed memory core MC. In a data input or write operation, in response to a write command WR transmitted from the control logic 190, the FIFO register 162_i may store data transmitted from the data buffer 161_i and may output the stored data to the parallelizer 163_i in a FIFO manner.

Likewise, in a data output or read operation, in response to a read command RD transmitted from the control logic 190, the FIFO register 162_i may store data transmitted from the serializer 164_i and may output the stored data to the data buffer 161_i in a FIFO manner.

The FIFO register 162_i may support write training. In response to a FIFO register write command WR_FIFO received from the control logic 190, the FIFO register 162_i may store data (e.g., training data) received from the data buffer 161_i. The FIFO register 162_i may not transmit the stored data to the parallelizer 163_i.

In response to a FIFO register read command RD_FIFO received from the control logic 190, the FIFO register 162_i may output the stored data (e.g., training data) to the data buffer 161_i. That is, in write training, training data may be transmitted to the FIFO register 162_i and may not be transmitted to the memory core MC.

In response to the write command WR, the parallelizer 163_i may parallelize data sequentially transmitted from the FIFO register 162_i and may output the parallelized data as a part of the input data DIN to the memory core MC. In response to the read command RD, the serializer 164_*i* may serialize a part of the output data DOUT received from the memory core MC and may transmit the serialized data to the FIFO register 162_*i*.

In some embodiments, first data delivery and training blocks, which are not associated with the redirector 120, from among the first data delivery and training blocks 160_0 to 160_15 may have the same structure as illustrated in FIG. 4A and may operate in the same manner as described with reference to FIG. 4A. Likewise, except for signals exchanged with the memory core MC and reference numerals of components, a second data delivery and training block, which is not associated with the redirector 120, from among the second data delivery and training blocks 170_0 and 170_1 may have the same structure as illustrated in FIG. 4A and may operate in the same manner as described with reference to FIG. 4A.

Figure 4B:
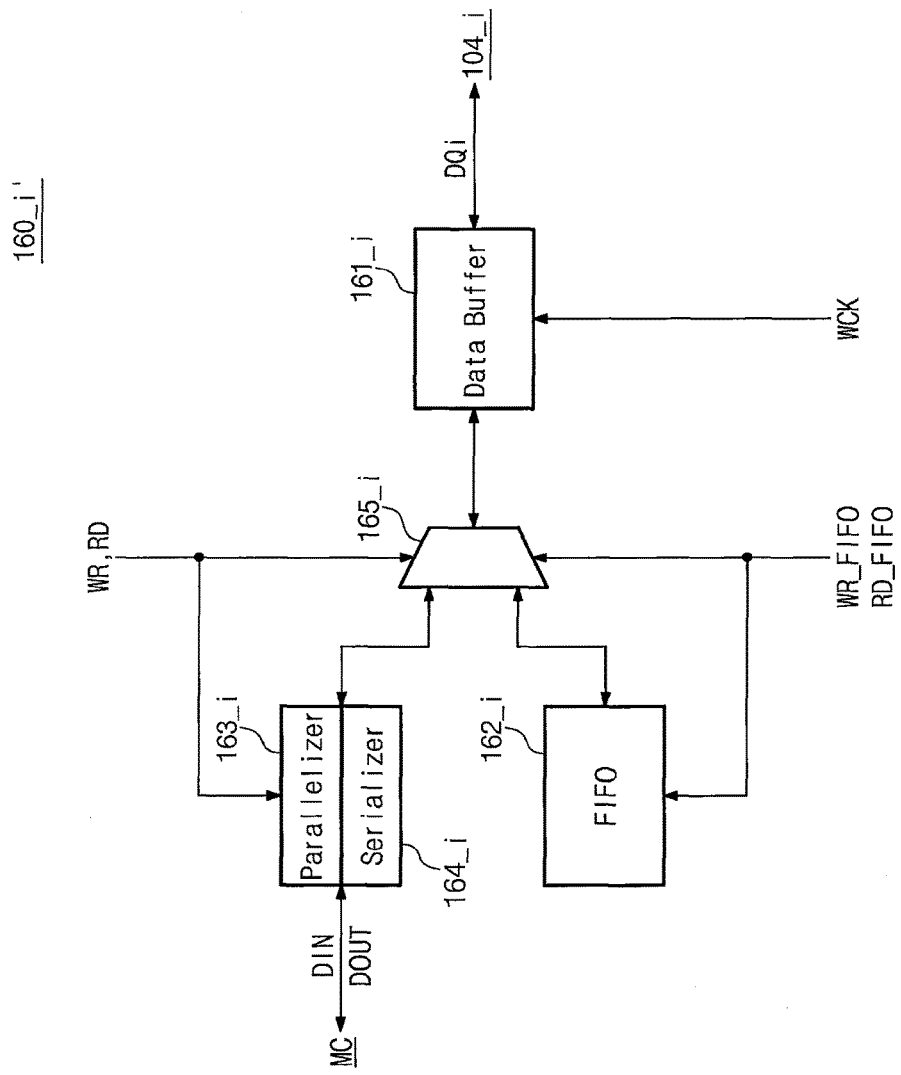
FIG. 4B illustrates an application of one of the first data delivery and training blocks, which is illustrated in FIG. 4A.

FIG. 4B illustrates an application of one of the first data delivery and training blocks 160_0 to 160_15, which is illustrated in FIG. 4A. In some embodiments, an example of a first data delivery and training block 160_*i*' that is not associated with the redirector 120 is illustrated in FIG. 4B. Referring to FIGS. 3 and 4B, the first data delivery and training block 160_*i*' includes the data buffer 161_*i*, the FIFO register 162_*i*, the parallelizer 163_*i*, the serializer 164_*i*, and an encoder 165_*i*.

In response to a write command WR or a read command RD from the control logic 190, the encoder 165_*i* may connect the parallelizer 163_*i* and the serializer 164_*i* with the data buffer 161_*i*. In response to a FIFO register write command WR_FIFO or a FIFO register read command RD_FIFO, the encoder 165_*i* may connect the FIFO register 162_*i* with the data buffer 161_*i*.

The parallelizer 163_*i* may parallelize the data signal DQi to the input data DIN depending on a write command WR. The serializer 164_*i* may serialize the output data DOUT to the data signal DQi depending on a read command RD. The FIFO register 162_*i* may store training data in response to the FIFO register write command WR_FIFO and may output the stored data as training data in response to the FIFO register read command RD_FIFO.

That is, in a write or read operation, the data signal DQi may be transmitted to the serializer 164_*i* or the parallelizer 163_*i* without passing through the FIFO register 162_*i*. The FIFO register 162_*i* may be a separate register provided for training. In some embodiments, and within the detailed description, the first data delivery and training block 160_*i* of FIG. 4A and the first data delivery and training block 160_*i*' of FIG. 4B may be interchangeably used.

Figure 5A:
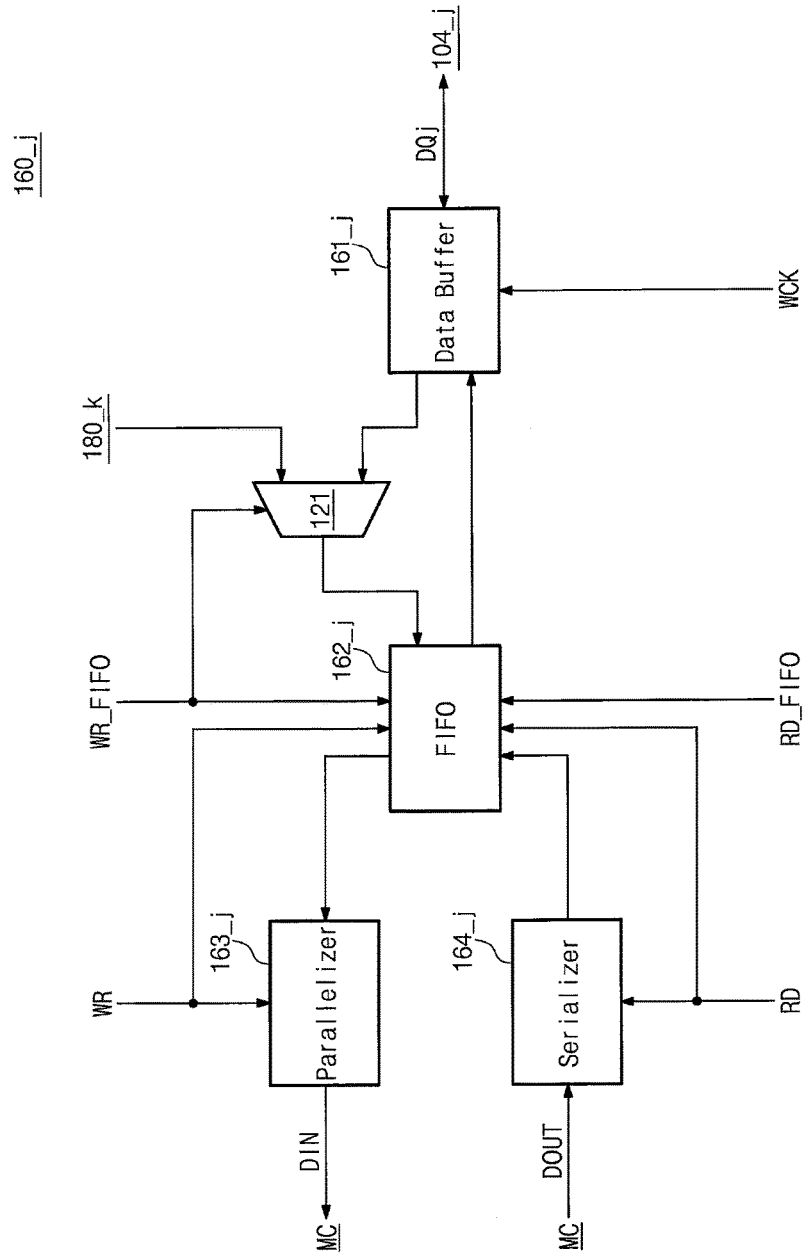
FIG. 5A illustrates another example of one of the first data delivery and training blocks according to embodiments of the inventive concepts.

FIG. 5A illustrates another example of one of the first data delivery and training blocks 160_0 to 160_15 according to embodiments of the inventive concepts. In some embodiments, an example of a first data delivery and training block 160_*j* that is associated with the redirector 120 is illustrated in FIG. 5A. Referring to FIGS. 3 and 5A, the first data delivery and training block 160_*j* includes a data buffer 161_*j*, a first-in first-out (FIFO) register 162_*j*, a parallelizer 163_*j*, and a serializer 164_*j*.

In a normal operation (e.g., not training), the data buffer 161_*j* may communicate a data signal DQj with a fourth memory pad 104_*j*. In training, the data buffer 161_*j* may communicate training data with the fourth memory pad 104_*j*.

The data buffer 161_*j*, the FIFO register 162_*j*, the parallelizer 163_*j*, and the serializer 164_*j* may operate in the same manner as described with reference to FIG. 4A, and thus, a description thereof will not be repeated here.

A first encoder. 121 of the redirector 120 may be positioned on a path through which the data buffer 161_*j* transmits data to the FIFO register 162_*j*. The first encoder 121 may operate in response to the FIFO register write command WR_FIFO. When the FIFO register write command WR_FIFO has a first option, the first encoder 121 may transmit an output of the data buffer 161_*j* to the FIFO register 162_*j*.

In training, when the FIFO register write command WR_FIFO has a second option, the first encoder 121 may store training data transmitted from a data delivery, clock generation and training block 180_*k*(refer to FIG. 6A) and may output the stored training data to the fourth memory pad 104_*j*. Accordingly, write training associated with the fourth memory pad 104_*j* may be performed.

In training, when the FIFO register write command WR_FIFO has the second option, the FIFO register 162_*i* may store training data transmitted from the data delivery, clock generation and training block 180_*k* and may output the stored training data through the fourth memory pad 104_*j*. Write training may be performed on the sixth memory pad 106_0 or 106_1 by redirecting an output of training data.

In some embodiments, except for signals exchanged with the memory core MC and reference numerals of components, a second data delivery and training block, which is associated with the redirector 120, from among the second data delivery and training blocks 170_0 and 170_1 may have the same structure as illustrated in FIG. 5A and may operate in the same manner as described with reference to FIG. 5A. That is, training data may be redirected to the first block 160 or the second block 170.

Figure 5B:
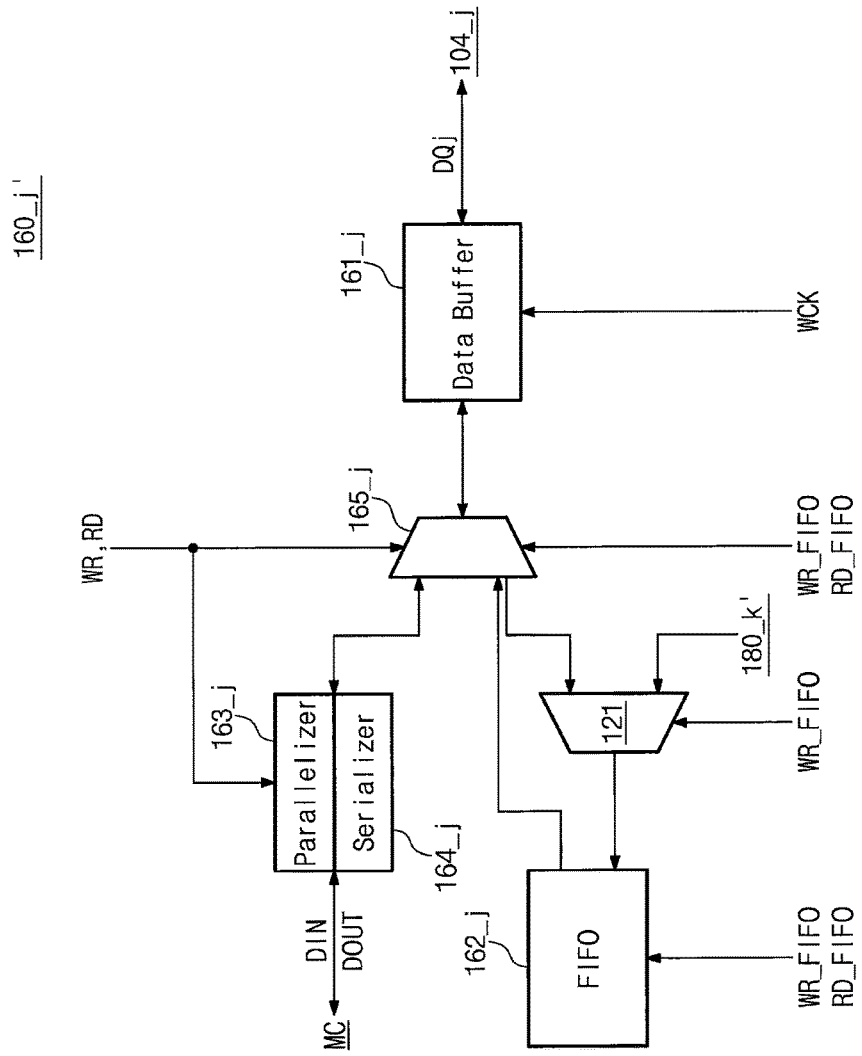
FIG. 5B illustrates an application of another of the first data delivery and training blocks, which is illustrated in FIG. 5A.

FIG. 5B illustrates an application of another of the first data delivery and training blocks 160_0 to 160_15, which is illustrated in FIG. 5A. In some embodiments, an example of a first data delivery and training block 160_*j*' that is associated with the redirector 120 is illustrated in FIG. 5B. Referring to FIGS. 3 and 5B, the first data delivery and training block 160_*j*' includes the data buffer 161_*j*, the FIFO register 162_*j*, the parallelizer 163_*j*, the serializer 164_*j*, and an encoder 165_*j*.

In response to a write command WR or a read command RD from the control logic 190, the encoder 165_*j* may connect the parallelizer 163_*j* and the serializer 164_*j* with the data buffer 161_*j*. In response to a FIFO register write command WR_FIFO or a FIFO register read command RD_FIFO, the encoder 165_*j* may connect an output of the FIFO register 162_*j* with the data buffer 161_*j* and may connect an output of the data buffer 161_*j* with the first encoder 121.

The parallelizer 163_*j* may parallelize a data signal DQj to the input data DIN depending on the write command WR. The serializer 164_*j* may serialize the output data DOUT to the data signal DQj depending on the read command RD.

When the FIFO register write command WR_FIFO has a first option, the first encoder 121 may transmit training data transmitted through the encoder 165_*j* from the data buffer 161_*j* to the FIFO register 162_*j*. When the FIFO register write command WR_FIFO has a second option, the first encoder 121 may transmit training data transmitted from a data delivery, clock generation and training block 180_*k*' (refer to FIG. 6B) to the FIFO register 162_*j*.

The FIFO register 162_*j* may store training data transmitted from the first encoder 121 in response to the FIFO register write command WR_FIFO and may output the stored data as training data to the encoder 165_*j* in response to the FIFO register read command RD_FIFO.

In some embodiments, and within the detailed description, the first data delivery and training block 160_j of FIG. 5A and the first data delivery and training block 160_j' of FIG. 5B may be interchangeably used.

Figure 6A:
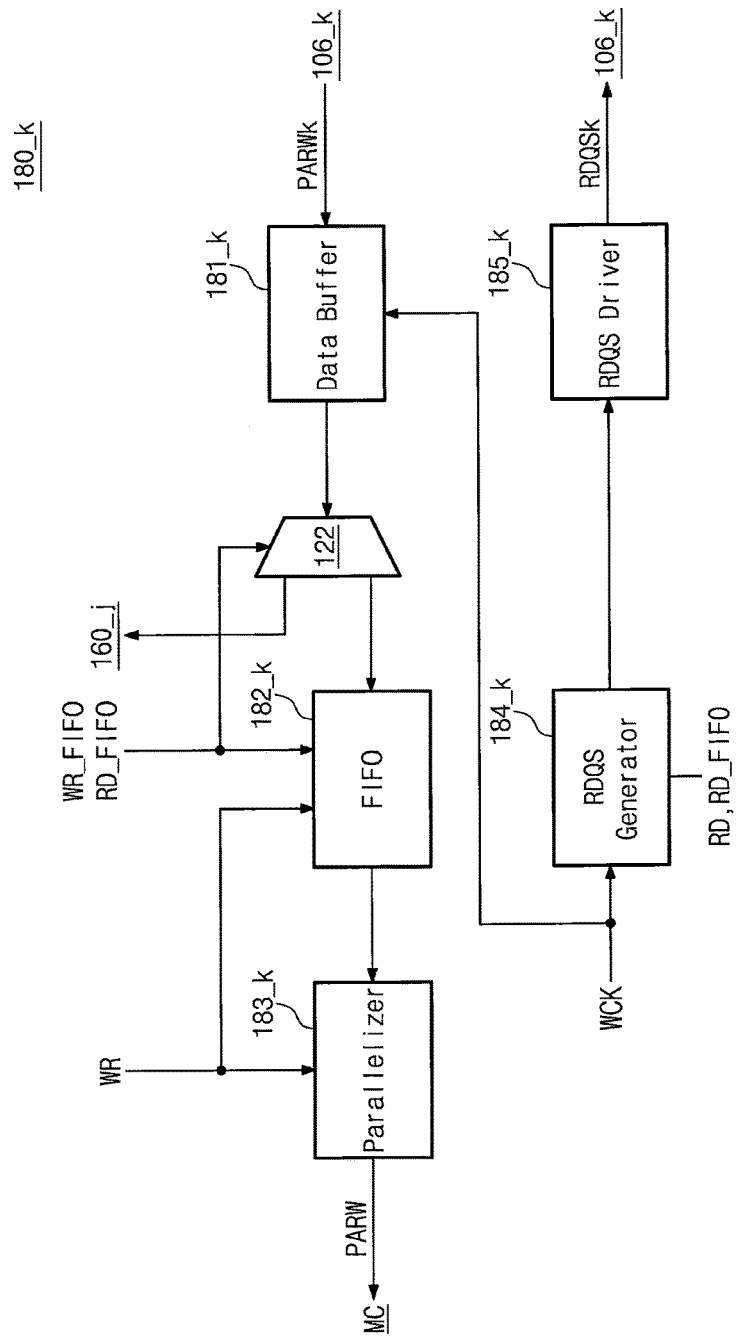
FIG. 6A illustrates an example of one of a data delivery, clock generation, and training blocks according to embodiments of the inventive concepts.

FIG. 6A illustrates an example of one of the data delivery, clock generation and training blocks 180_0 and 180_1 according to embodiments of the inventive concepts. Referring to FIGS. 3 and 6A, a data delivery, clock generation and training block 180_k includes a data buffer 181_k, a FIFO register 182_k, a parallelizer 183_k, a read data strobe signal generator 184_k, and a read data strobe signal driver 185_k.

A second encoder 122 of the redirector 120 may be positioned between the data buffer 181_k and the FIFO register 182_k. The data buffer 181_k may temporarily store data (e.g., a write parity signal PARWk or training data) received from the sixth memory pad 106_k and may transmit the stored data to the second encoder 122. The data buffer 181_k may operate in synchronization with one WCK of the write clock signals WCK[0:1].

The second encoder 122 may operate in response to the FIFO register write command WR_FIFO. When the FIFO register write command WR_FIFO has a first option or when the FIFO register write command WR_FIFO is absent, the second encoder 122 may transmit data output from the data buffer 181_k to the FIFO register 182_k.

When the FIFO register write command WR_FIFO has a second option, the second encoder 122 may transmit data output from the data buffer 181_k to the first data delivery and training block 160_j(refer to FIG. 5A). As another example, the second encoder 122 may transmit data output from the data buffer 181_k to the second data delivery and training block 170_0 or 170_1 associated with the redirector 120.

The FIFO register 182_k may compensate for a speed difference between a relatively high-speed data buffer 181_k and a relatively low-speed memory core MC. In a data input or write operation, in response to a write command WR transmitted from the control logic 190, the FIFO register 182_k may store data (e.g., the write parity signal PARWk) transmitted from the data buffer 181_k and may output the stored data to the parallelizer 183_k in a FIFO manner.

In response to a FIFO register write command WR_FIFO received from the control logic 190, the FIFO register 182_k may store data (e.g., training data) received from the data buffer 181_k. The FIFO register 182_k may not transmit the stored data to the parallelizer 183_k. In response to the write command WR, the parallelizer 183_k may parallelize data sequentially transmitted from the FIFO register 182_k and may output the parallelized data as a part of a write parity PARW to the memory core MC.

A read data strobe signal generator 184_k may generate a read data strobe signal RDQSk in response to one write clock signal WCK of the write clock signals WCK[0:1]. In response to a read command RD or a FIFO register read command RD_FIFO from the control logic 190, the read data strobe signal RDQSk is output to the sixth memory pad 106_k through a read data strobe signal driver 185_k.

In some embodiments, the data delivery, clock generation and training blocks 180_0 and 180_1 may have the structure described with reference to FIG. 6A and may operate in the manner described with reference to FIG. 6A. Clock generation blocks 180_2 and 180_3 associated with only read data strobe signals RDQS2 and RDQS3 may include the read data strobe signal generator 184_k and the read data strobe signal driver 185_k among components illustrated in FIG. 6A.

Figure 6B:
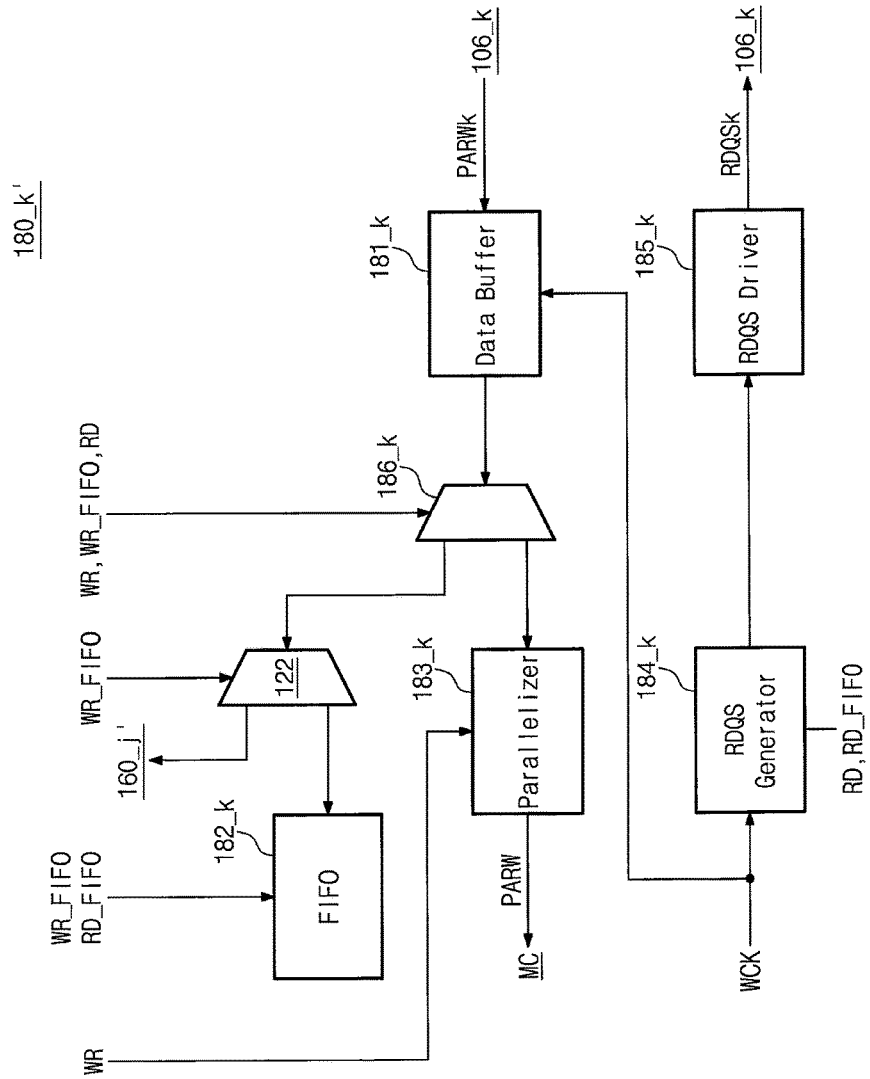
FIG. 6B illustrates an application of one of the data delivery, clock generation, and training blocks.

FIG. 6B illustrates an application of one of the data delivery, clock generation and training blocks 180_0 and 180_1. Referring to FIGS. 3 and 6B, a data delivery, clock generation and training block 180_k' includes the data buffer 181_k, the FIFO register 182_k, the parallelizer 183_k, the read data strobe signal generator 184_k, the read data strobe signal driver 185_k, and an encoder 186_k.

In response to a write command WR or a read command RD from the control logic 190, the encoder 186_k may connect the data buffer 181_k with the parallelizer 183_k. In response to a FIFO register write command WR_FIFO, the encoder 186_k may transmit an output of the data buffer 181_k to the second encoder 122. The parallelizer 183_k may parallelize a write parity signal PARWk to a write parity PARW depending on the write command WR.

When the FIFO register write command WR_FIFO has a first option, the second encoder 122 may transmit training data transmitted through the encoder 186_k from the data buffer 181_k to the FIFO register 182_k. When the FIFO register write command WR_FIFO has a second option, the second encoder 122 may transmit training data transmitted through the encoder 186_k from the data buffer 181_k to a data delivery and training block 160_j' (refer to FIG. 5B) of the first block 160 associated with the redirector 120 or a data delivery and training block of the second block 170.

In some embodiments, and within the detailed description, the data delivery, clock generation and training block 180_k of FIG. 6A and the data delivery, clock generation and training block 180_k' of FIG. 6B may be interchangeably used.

As described with reference to FIGS. 4A to 6B, the third block 180a may transmit training data received through the sixth memory pads 106_0 and 106_1 to the first block 160 or the second block 170 in response to the FIFO register write command WR_FIFO. A FIFO register of the first block 160 or the second block 170 may store training data.

The FIFO register of the first block 160 or the second block 170 may output the stored training data in response to a FIFO register read command RD_FIFO. That is, training data received in the third block 180a through the sixth memory pads 106_0 and 106_1 may be output to the outside after being redirected to the first block 160 or the second block 170. Accordingly, write training may be performed on the sixth memory pads 106_0 and 106_1.

Figure 7:
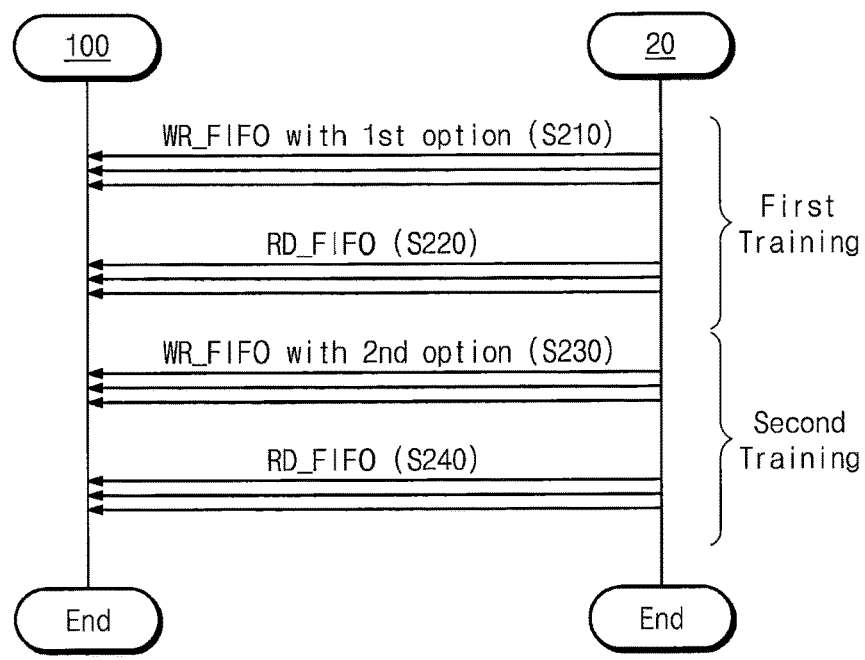
FIG. 7 is a flowchart illustrating a write training method according to embodiments of the inventive concepts.

FIG. 7 is a flowchart illustrating a write training method according to a first example of the inventive concept. Referring to FIGS. 1, 3, and 4A to 7, in operation S210, the controller 20 may transmit the FIFO register write command WR_FIFO having a first option to the semiconductor memory 100. The FIFO register write command WR_FIFO may be transmitted multiple times.

The controller 20 may transmit first training data to the semiconductor memory 100 together with the FIFO register write command WR_FIFO. For example, the first training data may be transmitted through the fourth memory pads 104_0 to 104_15 and the fifth memory pads 105_0 and 105_1. The semiconductor memory 100 may store the first training data in the FIFO registers (e.g., 162_i and/or 162_j) in response to the FIFO register write command WR_FIFO.

In operation S220, the controller 20 may transmit the FIFO register read command RD_FIFO to the semiconductor memory 100. In response to the FIFO register read command RD_FIFO, the semiconductor memory 100 may output the data stored in the FIFO registers (e.g., 162_i and/or 162_j) as second training data to the controller 20. The second training data may be transmitted through the fourth memory pads 104_0 to 104_15 and the fifth memory pads 105_0 and 105_1. The FIFO register read command RD_FIFO may be transmitted multiple times.

Operation S210 and operation S220 may constitute a first training operation targeted for pads that are not obstructed to output training data. Afterwards, in operation S230 and operation S240, a second training operation may be performed on pads that are obstructed to output training data. The second training operation may be redirected training in which an input pad and an output pad of training data are redirected.

In operation S230, the controller 20 may transmit the FIFO register write command WR_FIFO having a second option to the semiconductor memory 100. The controller 20 may transmit third training data to the semiconductor memory 100 together with the FIFO register write command WR_FIFO. For example, the third training data may be transmitted to the semiconductor memory 100 through the sixth memory pads 106_0 and 106_1. The FIFO register write command WR_FIFO may be transmitted multiple times.

In response to the FIFO register write command WR_FIFO having the second option, the semiconductor memory 100 may store the third training data in the FIFO register 162_j of at least one of the first data delivery and training blocks 160_0 to 160_15 of the first block 160 or at least one of the second data delivery and training blocks 170_0 and 170_1 of the second block 170.

In operation S240, the controller 20 may transmit the FIFO register read command RD_FIFO to the semiconductor memory 100. In response to the FIFO register read command RD_FIFO, at least one of the first data delivery and training blocks 160_0 to 160_15 or at least one of the second data delivery and training blocks 170_0 and 170_1 of the second block 170 may output the data stored in the FIFO register 162_j to the controller 20 as fourth training data. The fourth training data may be transmitted output at least one of the fourth memory pads 104_0 to 104_15 or at least one of the fifth memory pads 105_0 and 105_1. The FIFO register read command RD_FIFO may be transmitted multiple times.

Figure 8:
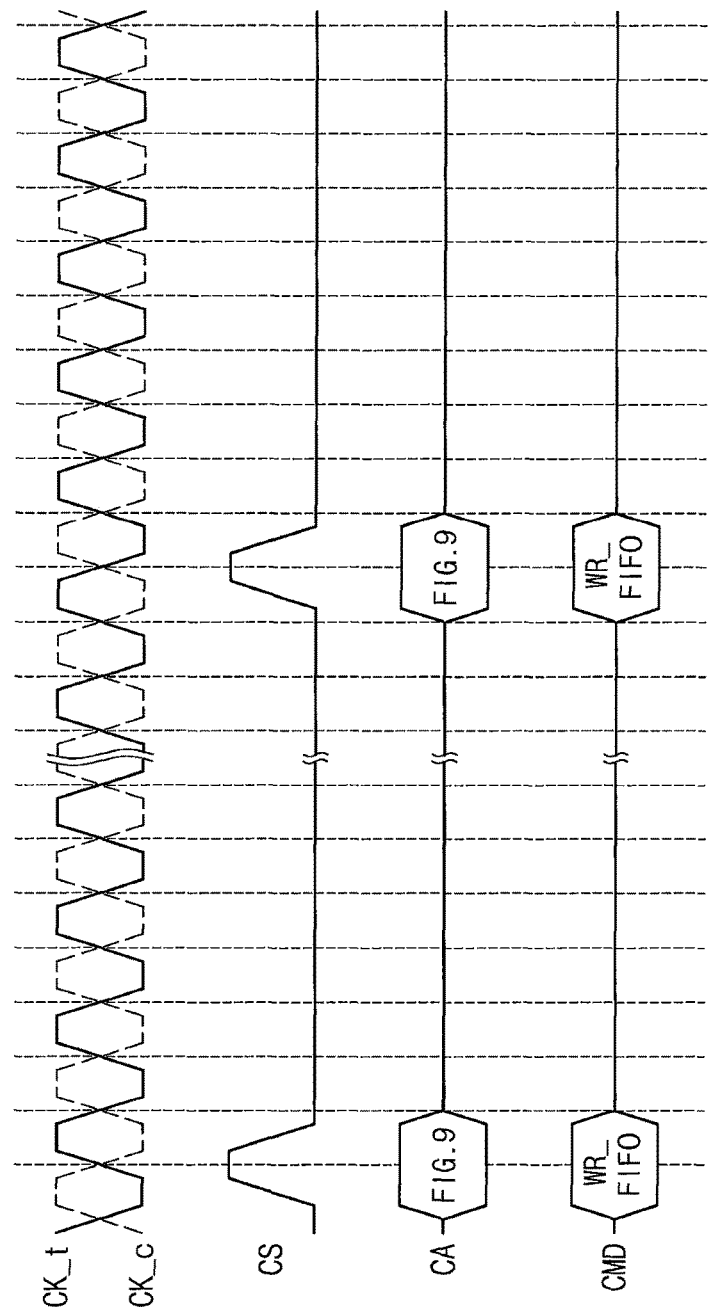
FIG. 8 illustrates an example in which a controller transmits a FIFO register write command to the semiconductor memory.

FIG. 8 illustrates an example in which the controller 20 transmits the FIFO register write command WR_FIFO to the semiconductor memory 100. In FIG. 8, "CK_t" indicates the clock signal CK, and "CK_c" indicates an inverted version of the clock signal CK. "CS" refers to a chip select signal to select the semiconductor memory 100. "CMD" shows command and address signals CA[0:6] conceptually and does not mean a signal that the controller 20 and the semiconductor memory 100 actually convey.

Referring to FIGS. 1, 3, and 8, when the chip select signal CS transitions to a high level, the controller 20 may transmit the FIFO register write command WR_FIFO to the semiconductor memory 100. The FIFO register write command WR_FIFO is transmitted through the command and address signals CA[0:6]. The FIFO register write command WR_FIFO may be transmitted during one cycle of the clock signal CK_t or CK_c. The FIFO register write command WR_FIFO will be more fully described with reference to FIG. 9.

For write training, the controller 20 may transmit the FIFO register write command WR_FIFO multiple times. An example is illustrated in FIG. 8 as the controller 20 transmits the FIFO register write command WR_FIFO two times or more. However, the controller 20 may transmit the FIFO register write command WR_FIFO once to perform the first training operation or the second training operation.

FIG. 9 illustrates an example of command and address signals CA0 to CA6 of the FIFO register write command WR_FIFO. Referring to FIGS. 8 and 9, an option of the FIFO register write command WR_FIFO may be determined according to whether the command and address signals CA0 to CA6 have any values at a falling edge "F" of the clock signal CK_t after the chip select signal CS has a high level "H".

For example, at a rising edge "R" of the clock signal CK_t when the chip select signal CS has the high level "H," the command and address signals CA0 to CA6 of the FIFO register write command WR_FIFO may sequentially have a low level "L," the low level "L," the low level "L," the low level "L," the low level "L," the high level "H," and the high level "H."

At the falling edge "F" of the clock signal CK_t regardless of a level of the chip select signal CS ("X"), the command and address signal CA0 of the FIFO register write command WR_FIFO having a first option has the low level "L." The remaining command and address signals CA1 to CA6 may have a valid level "V" corresponding to any one of a high level and a low level.

At the falling edge "F" of the clock signal CK_t regardless of a level of the chip select signal CS ("X"), the command and address signal CA0 of the FIFO register write command WR_FIFO having a second option has the high level "H." The remaining command and address signals CA1 to CA6 may have a valid level "V" corresponding to any one of a high level and a low level.

As described with reference to FIG. 9, an option of the FIFO register write command WR_FIFO is selected according to whether the command and address signal CA0 has the high level "H" or the low level "L" at the falling edge "F" of the clock signal CK_t. Since an additional cycle of the clock signal CK_t or an addition pad is unnecessary, the overhead due to options of the FIFO register write command WR_FIFO is suppressed.

Figure 10:
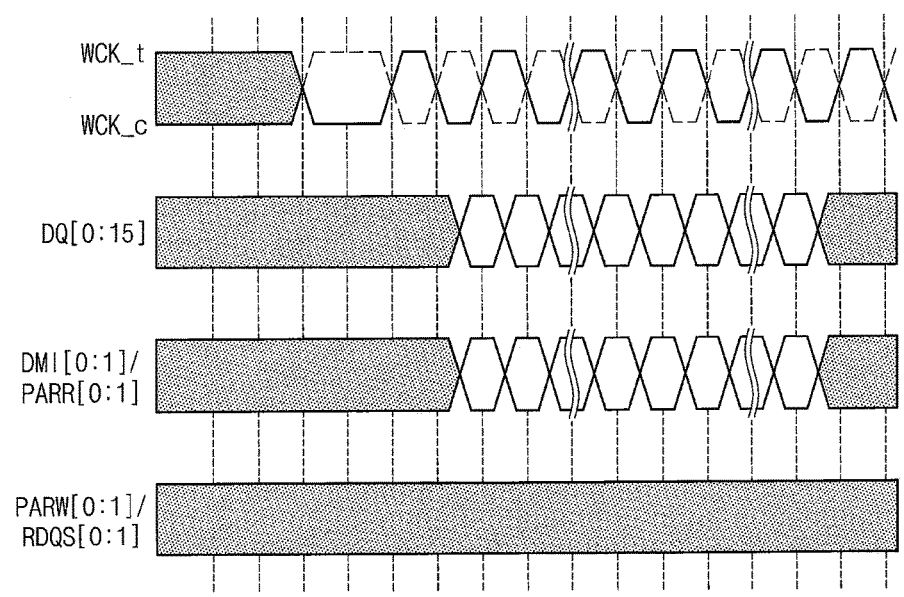
FIG. 10 illustrates an example in which the controller transmits first training data to the semiconductor memory depending on a FIFO register write command.

FIG. 10 illustrates an example in which the controller 20 transmits first training data to the semiconductor memory 100 depending on the FIFO register write command WR_FIFO. In some embodiments, an example in which first training data are transmitted according to the FIFO register write command WR_FIFO having a first option is illustrated in FIG. 10. In FIG. 10, "WCK_t" indicates one of the write clock signals WCK[0:1], and "WCK c" indicates an inverted version of the write clock signal WCK_t.

Referring to FIGS. 1, 3, 8, and 10, the controller 20 may transmit pieces of first training data to the semiconductor memory 100 when a specific time elapses after transmitting the FIFO register write command WR_FIFO. The first training data may be transmitted to the semiconductor memory 100 in synchronization with the write clock signal WCK_t or WCK_c.

The controller 20 may transmit a part of the first training data to the semiconductor memory 100 through the fourth memory pads 104_0 to 104_15 as the data signals DQ[0:15] in synchronization with a rising edge and a falling edge of the write clock signal WCK_t. The controller 20 may transmit the remaining part of the first training data to the semiconductor memory 100 through the fifth memory pads 105_0 and 105_1 as the data mask inversion signals DMI[0:1] in synchronization with the rising edge and the falling edge of the write clock signal WCK_t.

An embodiment is illustrated in FIG. 10 as the first training data are not transmitted to the semiconductor memory 100 through the sixth memory pads 106_0 and 106_1 or as the write parity signals PARW[0:1]. However, the controller 20 may be changed to transmit another part of the first training data or dummy data to the semiconductor memory 100 through the sixth memory pads 106_0 and 106_1 as the write parity signals PARW[0:1].

Figure 11:
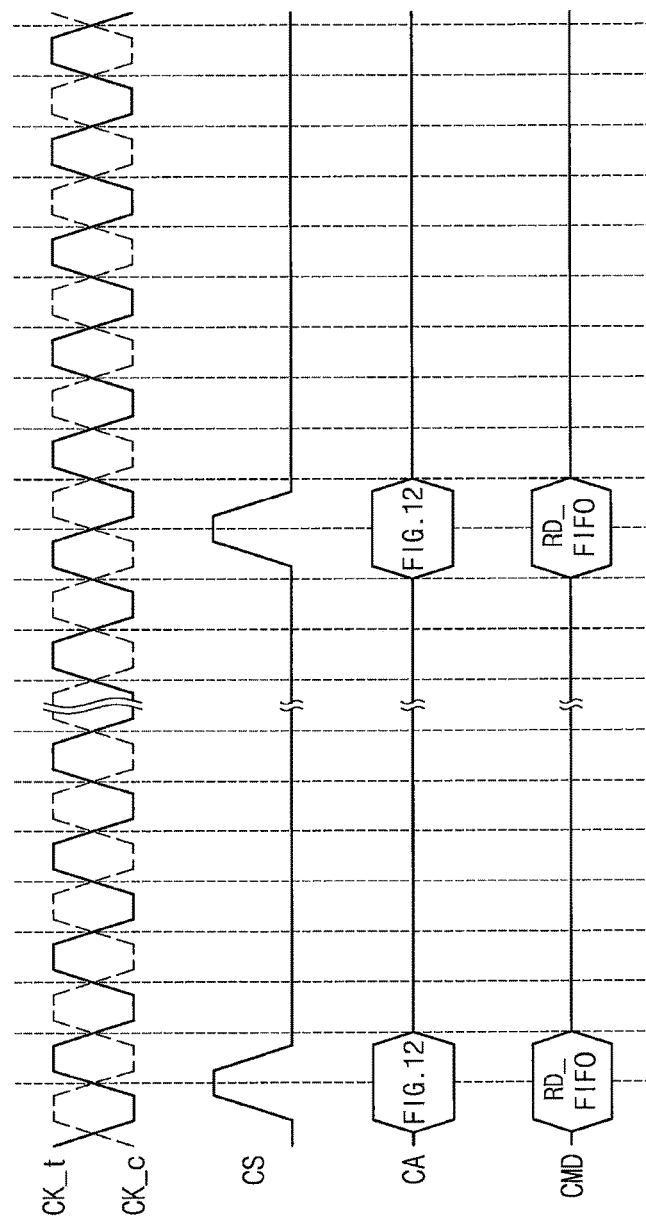
FIG. 11 illustrates an example in which the controller transmits the FIFO register read command to the semiconductor memory.

FIG. 11 illustrates an example in which the controller 20 transmits the FIFO register read command RD_FIFO to the semiconductor memory 100. In FIG. 11, "CK_t" indicates the clock signal CK, and "CK_c" indicates an inverted version of the clock signal CK. "CS" refers to a chip select signal to select the semiconductor memory 100. "CMD" shows command and address signals CA[0:6] conceptually and does not mean a signal that the controller 20 and the semiconductor memory 100 actually convey.

Referring to FIGS. 1, 3, and 11, when the chip select signal CS transitions to a high level, the controller 20 may transmit the FIFO register read command RD_FIFO to the semiconductor memory 100. The FIFO register read command RD_FIFO is transmitted through the command and address signals CA[0:6]. The FIFO register read command RD_FIFO may be transmitted during one cycle of the clock signal CK_t or CK_c. The FIFO register read command RD_FIFO will be more fully described with reference to FIG. 12.

For write training, the controller 20 may transmit the FIFO register read command RD_FIFO multiple times. An example is illustrated in FIG. 11 as the controller 20 transmits the FIFO register read command RD_FIFO two times or more. However, the controller 20 may transmit the FIFO register read command RD_FIFO once to perform the first training operation or the second training operation.

FIG. 12 illustrates an example of command and address signals CA0 to CA6 of the FIFO register read command RD_FIFO. Referring to FIGS. 11 and 12, at a rising edge "R" of the clock signal CK_t when the chip select signal CS has the high level "H" the command and address signals CA0 to CA6 of the FIFO register read command RD_FIFO may sequentially have the low level "L," the low level "L," the low level "L," the low level "L," the low level "L," the high level "H," and the low level "L."

At a falling edge "F" of the clock signal CK_t regardless of a level of the chip select signal CS ("X"), the command and address signals CA0 to CA6 of the FIFO register read command RD_FIFO may have a valid value "V" corresponding to any one of a high level and a low level. For example, the FIFO register read command RD_FIFO that does not have an option may not be associated with a falling edge of the clock signal CK_t.

Figure 13:
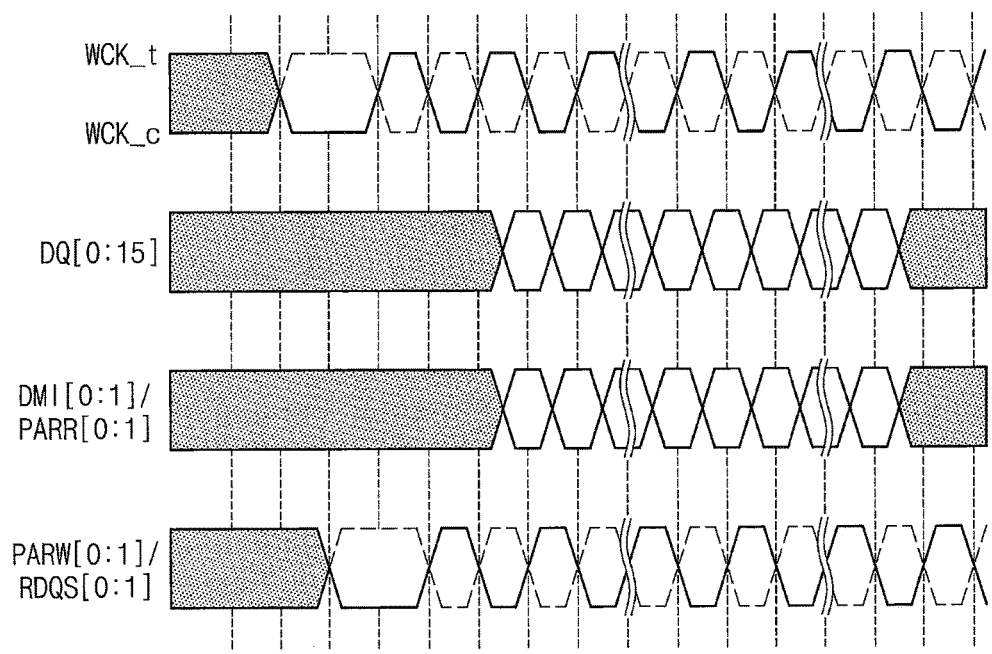
FIG. 13 illustrates an example in which the semiconductor memory transmits second training data to the controller depending on the FIFO register read command.

FIG. 13 illustrates an example in which the semiconductor memory 100 transmits second training data to the controller 20 depending on the FIFO register read command RD_FIFO. In some embodiments, an example in which second training data are transmitted according to the FIFO register read command RD_FIFO following the FIFO register write command WR_FIFO having a first option is illustrated in FIG. 13. In FIG. 13, "WCK_t" indicates one of the write clock signals WCK[0:1], and "WCK_c" indicates an inverted version of the write clock signal WCK_t.

Referring to FIGS. 1, 3, 11, and 13, the semiconductor memory 100 may receive the FIFO register read command RD_FIFO and may transmit second training data to the controller 20 when a specific time elapses. The second training data may be transmitted in synchronization with the read data strobe signals RDQS[0:1] (or RDQS0 and RDQS1) output through the sixth memory pads 106_0 and 106_1 or the read data strobe signals RDQS2 and RDQS3 output through the sixth memory pads 106_2 and 106_3.

The semiconductor memory 100 may transmit a part of the second training data to the controller 20 through the fourth memory pads 104_0 to 104_15 as the data signals DQ[0:15] in synchronization with a rising edge and a falling edge of the read data strobe signals RDQS[0:1]. The semiconductor memory 100 may transmit the remaining part of the second training data to the controller 20 through the fifth memory pads 105_0 and 105_1 as the read parity signals PARR[0:1] in synchronization with a rising edge and a falling edge of the read data strobe signals RDQS[0:1].

Figure 14:
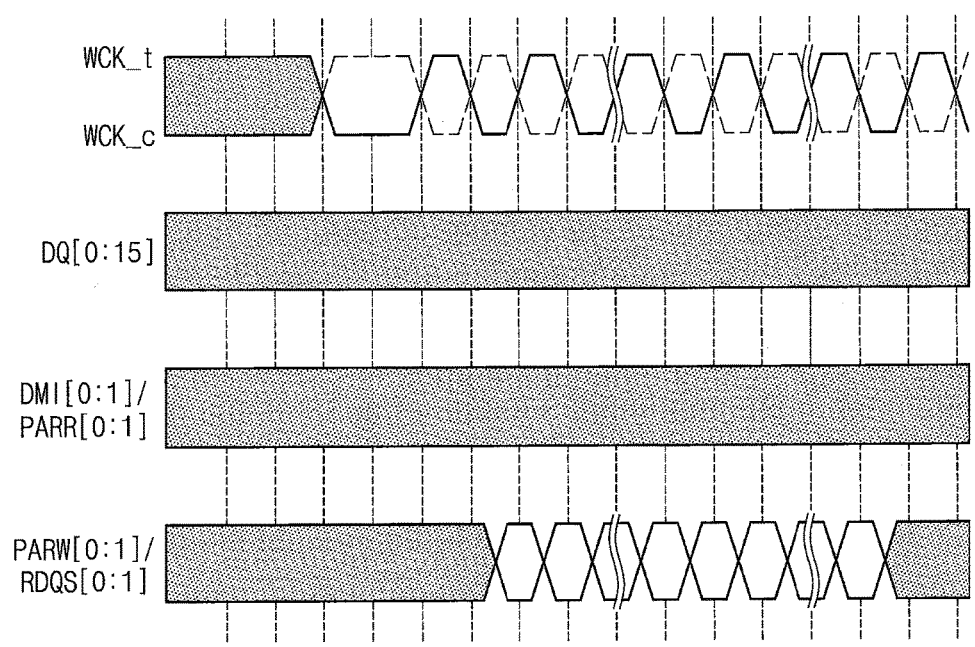
FIG. 14 illustrates an example in which the controller transmits third training data to the semiconductor memory depending on a FIFO register write command.

FIG. 14 illustrates an example in which the controller 20 transmits third training data to the semiconductor memory 100 depending on the FIFO register write command WR_FIFO. In some embodiments, an example in which third training data are transmitted according to the FIFO register write command WR_FIFO having a second option is illustrated in FIG. 14. In FIG. 14, "WCK_t" indicates one of the write clock signals WCK[0:1], and "WCK_c" indicates an inverted version of the write clock signal WCK_t.

Referring to FIGS. 1, 3, 8, and 14, the controller 20 may transmit the FIFO register write command WR_FIFO and may transmit third training data to the semiconductor memory 100 when a specific time elapses. The third training data may be transmitted to the semiconductor memory 100 in synchronization with the write clock signal WCK_t or WCK_c.

The controller 20 may transmit the third training data to the semiconductor memory 100 through the sixth memory pads 106_0 and 106_1 as the write parity signals PARW[0:1] in synchronization with a rising edge and a falling edge of the write clock signal WCK_t. An embodiment is illustrated in FIG. 14 as the third training data are not transmitted to the semiconductor memory 100 through the fourth memory pads 104_0 to 104_15 and the fifth memory pads 105_0 and 105_1. However, the controller 20 may be changed to transmit another part of the third training data or dummy data to the semiconductor memory 100 through the fourth memory pads 104_0 to 104_15 and the fifth memory pads 105_0 and 105_1.

Figure 15:
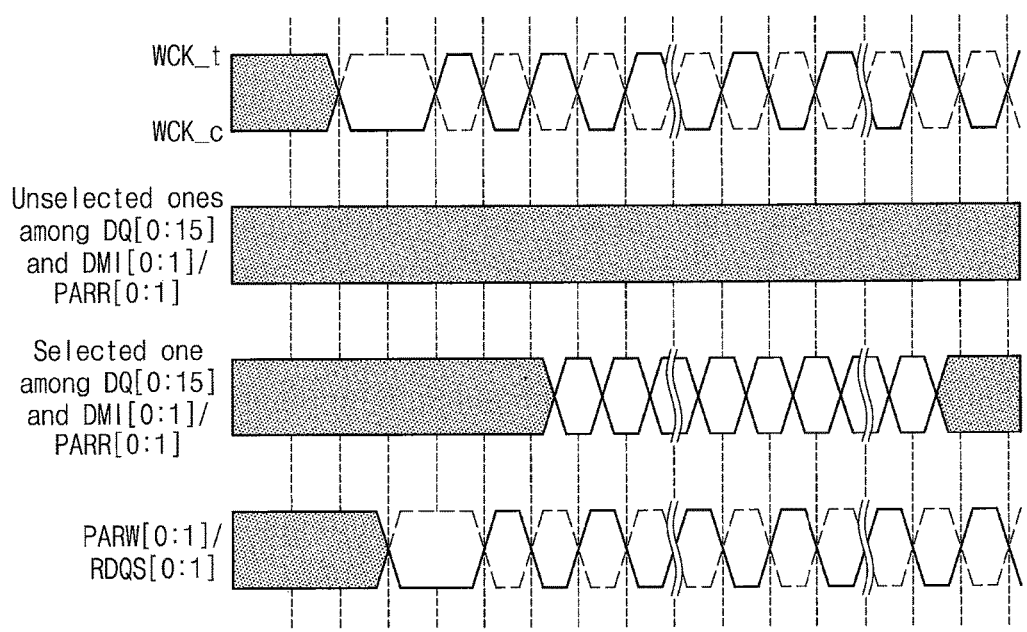
FIG. 15 illustrates an example in which the semiconductor memory transmits fourth training data to the controller depending on a FIFO register read command.

FIG. 15 illustrates an example in which the semiconductor memory 100 transmits fourth training data to the controller 20 depending on the FIFO register read command RD_FIFO. In some embodiments, an example in which fourth training data are transmitted according to the FIFO register read command RD_FIFO following the FIFO register write command WR_FIFO having a second option is illustrated in FIG. 15. In FIG. 15, "WCK_t" indicates one of the write clock signals WCK[0:1], and "WCK_c" indicates an inverted version of the write clock signal WCK_t.

Referring to FIGS. 1, 3, 11, and 15, the semiconductor memory 100 may receive the FIFO register read command RD_FIFO and may transmit fourth training data to the controller 20 when a specific time elapses. The fourth training data may be transmitted in synchronization with the read data strobe signals RDQS[0:1] (or RDQS0 and RDQS1) output through the sixth memory pads 106_0 and 106_1 or the read data strobe signals RDQS2 and RDQS3 output through the sixth memory pads 106_2 and 106_3.

The semiconductor memory 100 may transmit the fourth training data through at least one selected from the data signals DQ[0:15] and the read parity signals PARR[0:1] to the controller 20 in synchronization with a rising edge and a falling edge of the read data strobe signals RDQS[0:1]. Signals that are not selected from the data signals DQ[0:15] and the read parity signals PARR[0:1] may not be used to transmit the fourth training data.

In some embodiments, the third training data received through one sixth memory pad 106_0 or 106_1 may be output through two or more pads. For example, the fourth memory pads 104_0 to 104_15 and the fifth memory pads 105_0 and 105_1 may output the fourth training data (or a replica of the fourth training data) as the data signals DQ[0:15] and the read parity signals PARR[0:1].

Figure 16A:
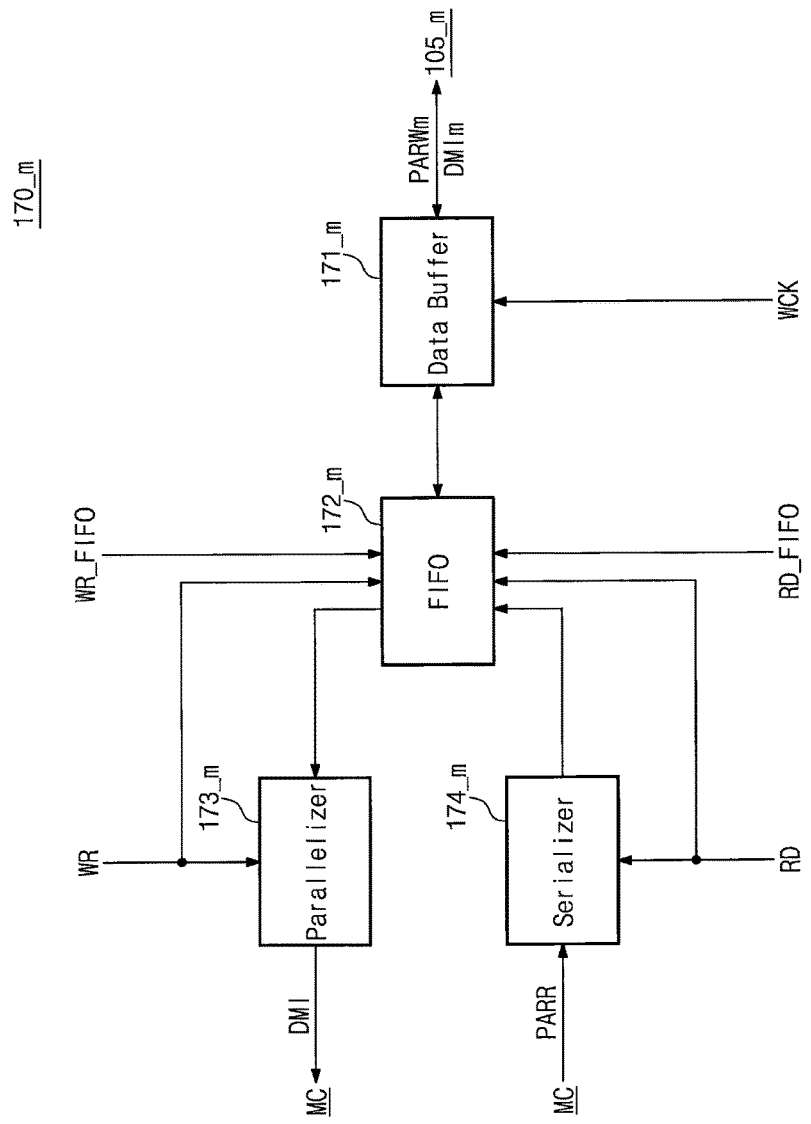
FIG. 16A illustrates an example of one of second data delivery and training blocks according to embodiments of the inventive concepts.

FIG. 16A illustrates an example of one of the second data delivery and training blocks 170_0 and 170_1 according to embodiments of the inventive concepts. In some embodiments, an example of a second data delivery and training block 170_m that is not associated with the redirector 120 is illustrated in FIG. 16A. Referring to FIGS. 3 and 16A, the second data delivery and training block 170_m includes a data buffer 171_m, a first-in first-out (FIFO) register 172_m, a parallelizer 173_m, and a serializer 174_m.

In a normal operation (e.g., not training), the data buffer 171_m may communicate a write parity signal PARWm and a data mask inversion signal DMIm with a fifth memory pad 105_m. In training, the data buffer 171_m may communicate training data with the fifth memory pad 105_m.

In some embodiments, the second data delivery and training block 170_m may operate in the same manner as the first data delivery and training block 160_i, which is described with reference to FIG. 4A, and thus, a description thereof will not be repeated here.

In some embodiments, except for signals exchanged with the memory core MC and reference numerals of components, first data delivery and training blocks, which are not associated with the redirector 120, from among the first data delivery and training blocks 160_0 to 160_15 may have the same structure as illustrated in FIG. 16A and may operate in the same manner as described with reference to FIG. 16A.

Figure 16B:
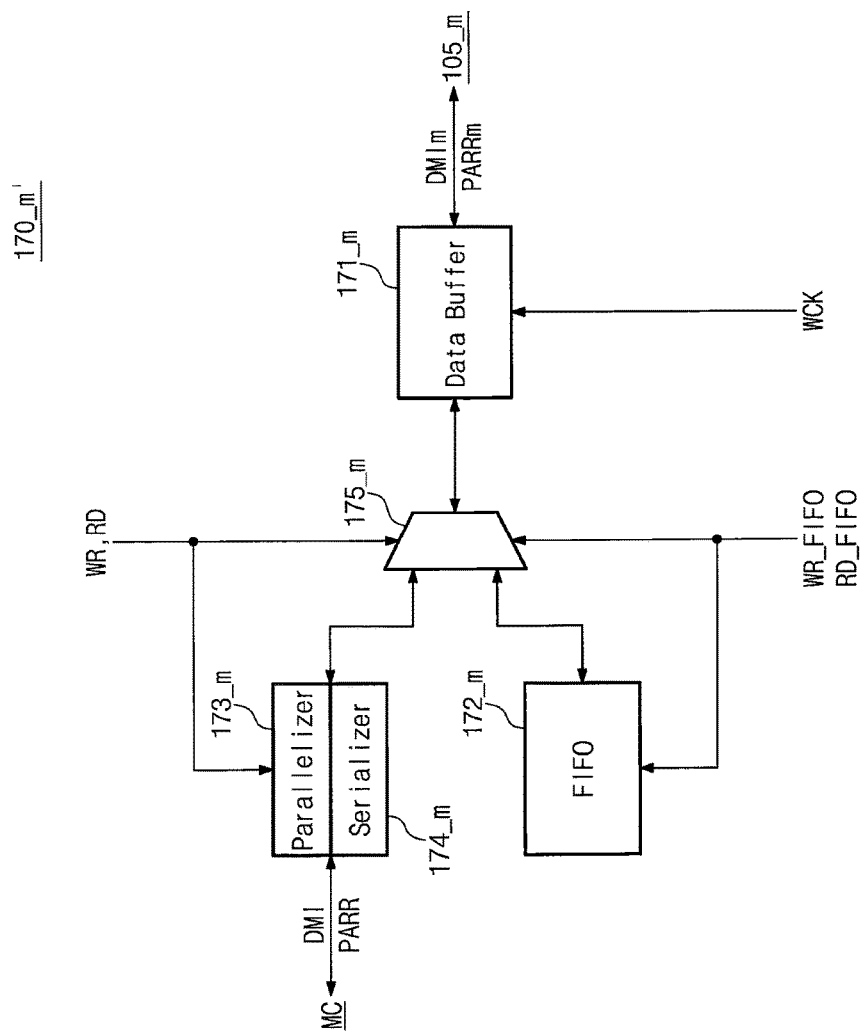
FIG. 16B illustrates another example of one of the second data delivery and training blocks according to embodiments of the inventive concepts.

FIG. 16B illustrates another example of one of the second data delivery and training blocks 170_0 and 170_1 according to embodiments of the inventive concept. In some embodiments, an example of a second data delivery and training block 170_m' that is not associated with the redirector 120 is illustrated in FIG. 16B. Referring to FIGS. 3 and 16B, a second data delivery and training block 170_m' includes the data buffer 171_m, the FIFO register 172_m, the parallelizer 173_m, the serializer 174_m, and an encoder 175_m.

In some embodiments, the second data delivery and training block 170_m' may operate in the same manner as the first data delivery and training block 160_i', which is described with reference to FIG. 4B, and thus, a description thereof will not be repeated here.

In some embodiments, except for signals exchanged with the memory core MC and reference numerals of components, first data delivery and training blocks, which are not associated with the redirector 120, from among the first data delivery and training blocks 160_0 to 160_15 may have the same structure as illustrated in FIG. 16B and may operate in the same manner as described with reference to FIG. 16B.

In some embodiments, in the detailed description, the second data delivery and training block 170_m of FIG. 16A and the second data delivery and training block 170_m' of FIG. 16B may be interchangeably used.

Figure 17A:
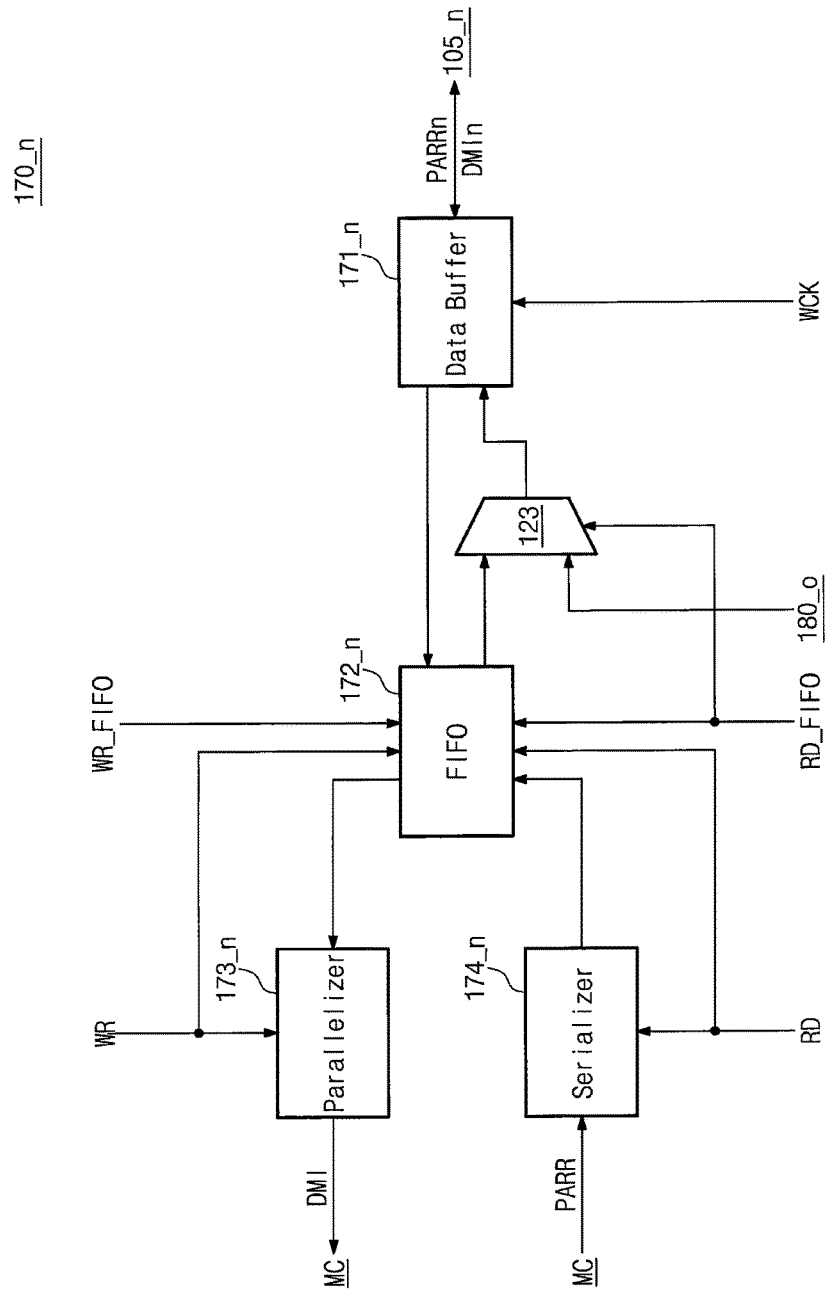
FIG. 17A illustrates an example of another of the second data delivery and training blocks according to embodiments of the inventive concepts.

FIG. 17A illustrates an example of one of the second data delivery and training blocks 170_0 and 170_1 according to embodiments of the inventive concepts. In some embodiments, an example of a second data delivery and training block 170_n that is associated with the redirector 120 is illustrated in FIG. 17A. Referring to FIGS. 3 and 17A, the second data delivery and training block 170_n includes a data buffer 171_n, a first-in first-out (FIFO) register 172_n, a parallelizer 173_n, and a serializer 174_n.

In a normal operation, not training, the data buffer 171_n may communicate a write parity signal PARRn and a data mask inversion signal DMIn with a fifth memory pad 105_n. In training, the data buffer 171_n may communicate training data with the fifth memory pad 105_n.

The data buffer 171_n, the FIFO register 172_n, the parallelizer 173_n, and the serializer 174_n operate in the same manner as described with reference to FIG. 4A, and thus, a description thereof will not be repeated here.

A third encoder 123 of the redirector 120 may be positioned on a path through which the FIFO register 172_n transmits data to the data buffer 171_n. The third encoder 123 may operate in response to the FIFO register read command RD_FIFO. When the FIFO register read command RD_FIFO has a first option, the third encoder 123 may transmit an output of the FIFO register 172_n to the data buffer 171_n.

When the FIFO register read command RD_FIFO has a second option, the third encoder 123 may transmit data (e.g., training data) transmitted from a data delivery, clock generation and training block 180_o(refer to FIG. 18B) to the data buffer 171_n.

That is, if the FIFO register write command WR_FIFO is received following the FIFO register read command RD_FIFO having a first option, the data buffer 171_n may output training data transmitted from the FIFO register 172_n to the fifth memory pad 105_n. Accordingly, write training associated with the fifth memory pad 105_n is performed.

If the FIFO register write command WR_FIFO is received following the FIFO register read command RD_FIFO having a second option, the data buffer 171_n may output training data transmitted from the data delivery, clock generation and training block 180_o(refer to FIG. 18A) to the fifth memory pad 105_n. Write training may be performed on the sixth memory pad 106_0 or 106_1 by redirecting an output of training data.

In some embodiments, except for signals exchanged with the memory core MC and reference numerals of components, a first data delivery and training block, which is associated with the redirector 120, from among the first data delivery and training blocks 160_0 to 160_15 may have the same structure as illustrated in FIG. 17A and may operate in the same manner as described with reference to FIG. 17A. That is, training data may be redirected to the first block 160 or the second block 170.

Figure 17B:
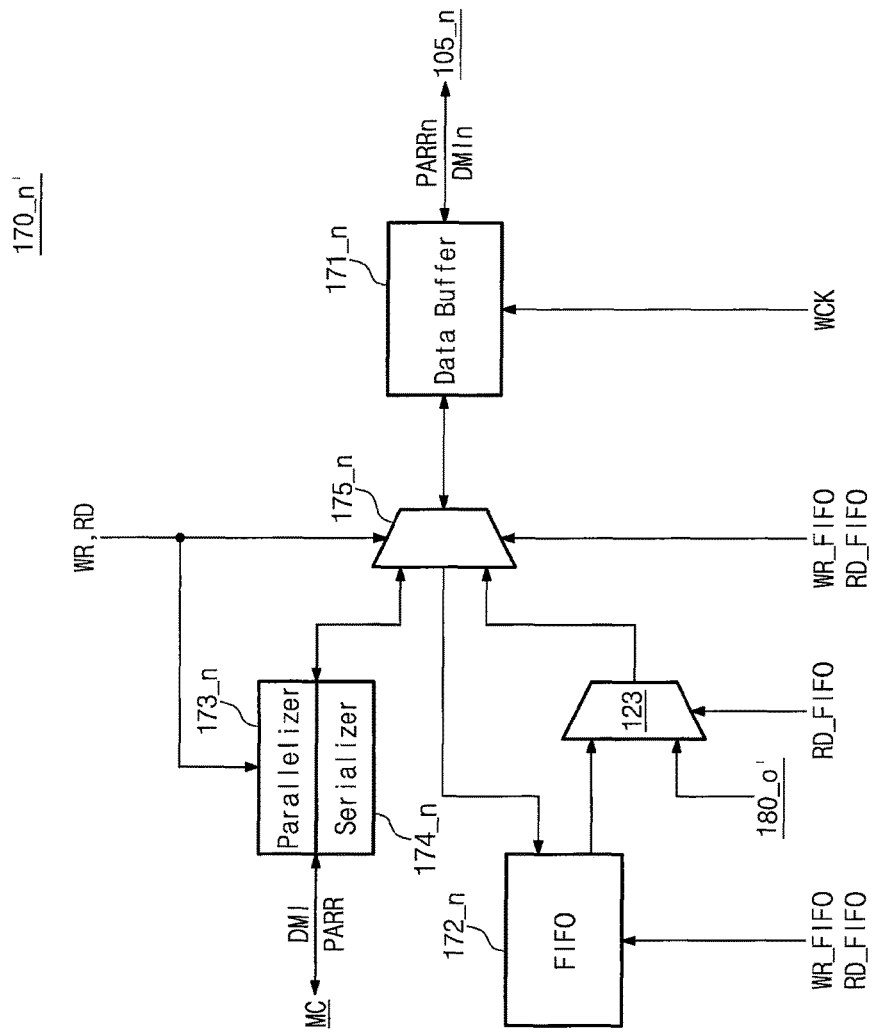
FIG. 17B illustrates an application of one of the second data delivery and training blocks according to embodiments of the inventive concepts.

FIG. 17B illustrates an example of one of the second data delivery and training blocks 170_0 and 170_1 according to embodiments of the inventive concepts. In some embodiments, an example of a second data delivery and training block 170_n' that is associated with the redirector 120 is illustrated in FIG. 17B. Referring to FIGS. 3 and 17B, a second data delivery and training block 170_n' includes the data buffer 171_n, the FIFO register 172_n, the parallelizer 173_n, the serializer 174_n, and an encoder 175_n.

In response to a write command WR or a read command RD from the control logic 190, the encoder 175_n may connect the parallelizer 173_n or the serializer 174_n with the data buffer 171_n. In response to the FIFO register write command WR_FIFO or the FIFO register read command RD_FIFO, the encoder 175_n may connect an output of the data buffer 171_n with the FIFO register 172_n and may transmit training data transmitted through the third encoder 123 to the data buffer 171_n.

The parallelizer 173_*n* may parallelize a data mask inversion signal DMIn to the data mask inversion signal DMI depending on the write command WR. The serializer 174_*n* may serialize a read parity PARR to a read parity signal PARRn depending on the read command RD.

When the FIFO register read command RD_FIFO has a first option, the third encoder 123 may transmit training data transmitted from the FIFO register 172_*n* to the data buffer 171_*n* through the encoder 175_*n*. When the FIFO register read command RD_FIFO has a second option, the third encoder 123 may transmit training data transmitted from a data delivery, clock generation and training block 180_*o*' (refer to FIG. 18B) to the data buffer 171_*n*.

In some embodiments, and within the detailed description, the second data delivery and training block 170_*n* of FIG. 17A and the second data delivery and training block 170_*n*' of FIG. 17B may be interchangeably used.

Figure 18A:
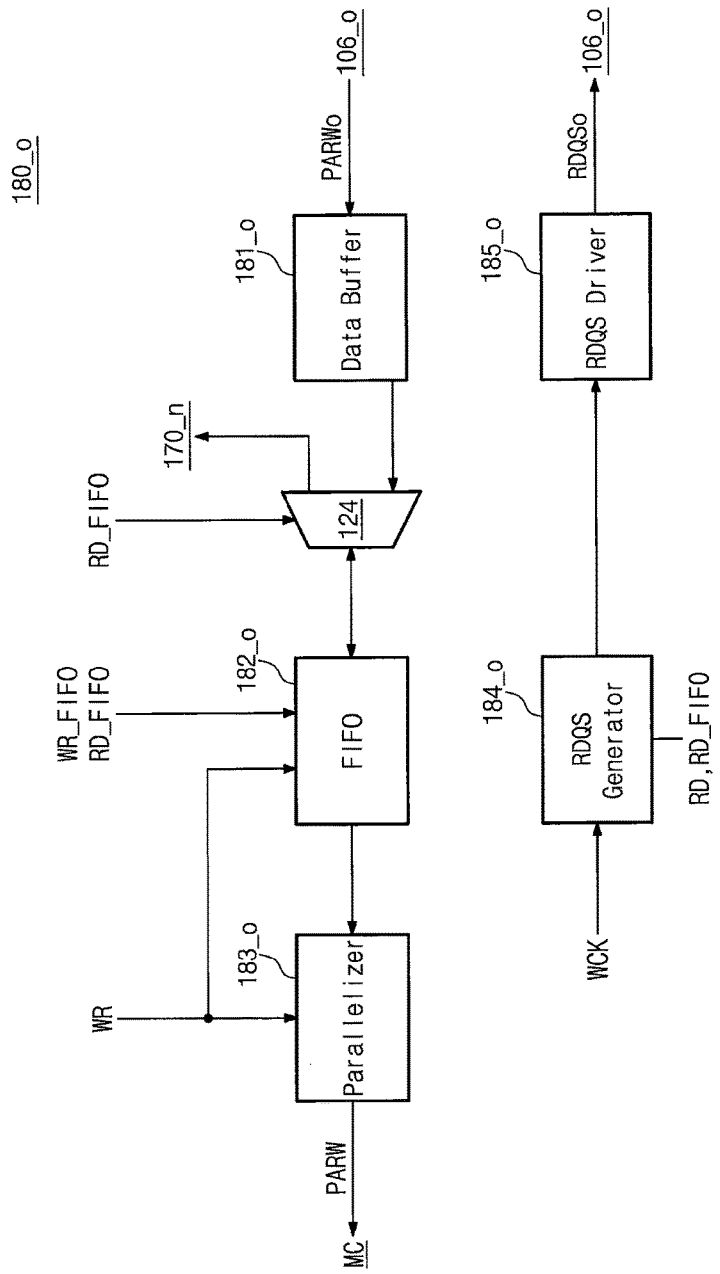
FIG. 18A illustrates another example of one of data delivery, clock generation, and training blocks according to embodiments of the inventive concepts.

FIG. 18A illustrates an example of one of the data delivery, clock generation and training blocks 180_0 and 180_1 according to embodiments of the inventive concepts. Referring to FIGS. 3 and 18A, a data delivery, clock generation and training block 180_*o* includes a data buffer 181_*o*, a FIFO register 182_*o*, a parallelizer 183_*o*, a read data strobe signal generator 184_*o*, and a read data strobe signal driver 185_*o*.

A fourth encoder 124 of the redirector 120 may be positioned between the data buffer 181_*o* and the FIFO register 182_*o*. The data buffer 181_*o* may temporarily store data (e.g., a write parity signal PARWo or training data) received from the sixth memory pad 106_*o* and may transmit the stored data to the fourth encoder 124. The data buffer 181_*o* may operate in synchronization with one WCK of the write clock signals WCK[0:1].

The fourth encoder 124 may operate in response to the FIFO register read command RD_FIFO. When the FIFO register read command RD_FIFO has a first option or when the FIFO register read command RD_FIFO is absent, the fourth encoder 124 may connect the data buffer 181_*o* and the FIFO register 182_*o*.

When the FIFO register read command RD_FIFO has a second option, the fourth encoder 124 may connect the FIFO register 182_*o* and the second data delivery and training block 170_*n* of FIG. 17A. For example, the fourth encoder 124 may transmit data (e.g., training data) transmitted from the FIFO register 182_*o* to the second data delivery and training block 170_*n* associated with the redirector 120.

As another example, the fourth encoder 124 may transmit data (e.g., training data) transmitted from the FIFO register 182_*o* to a first data delivery and training block associated with the redirector 120 among the first data delivery and training blocks 160_0 to 160_15.

In a normal operation (e.g., not training), the data buffer 181_*o* may receive the write parity signal PARWo from the sixth memory pad 106_*o*. In training, the data buffer 181_*o* may receive training data from the sixth memory pad 106_*o*. When data are output regardless of training, the read data strobe signal driver 185_*o* may output a read data strobe signal RDQSo.

The FIFO register 182_*o*, the parallelizer 183_*o*, the read data strobe signal generator 184_*o*, and the read data strobe signal driver 185_*o* operate the same as described with reference to FIG. 6A, and thus, a description thereof will not be repeated here.

In some embodiments, data delivery, clock generation and training blocks 180_0 and 180_1 may have the structure described with reference to FIG. 18A and may operate in the manner described with reference to FIG. 18A. Clock generation blocks 180_2 and 180_3 associated with read data strobe signals RDQS2 and RDQS3 may include the read data strobe signal generator 184_*o* and the read data strobe signal driver 185_*o* among components illustrated in FIG. 18A.

Figure 18B:
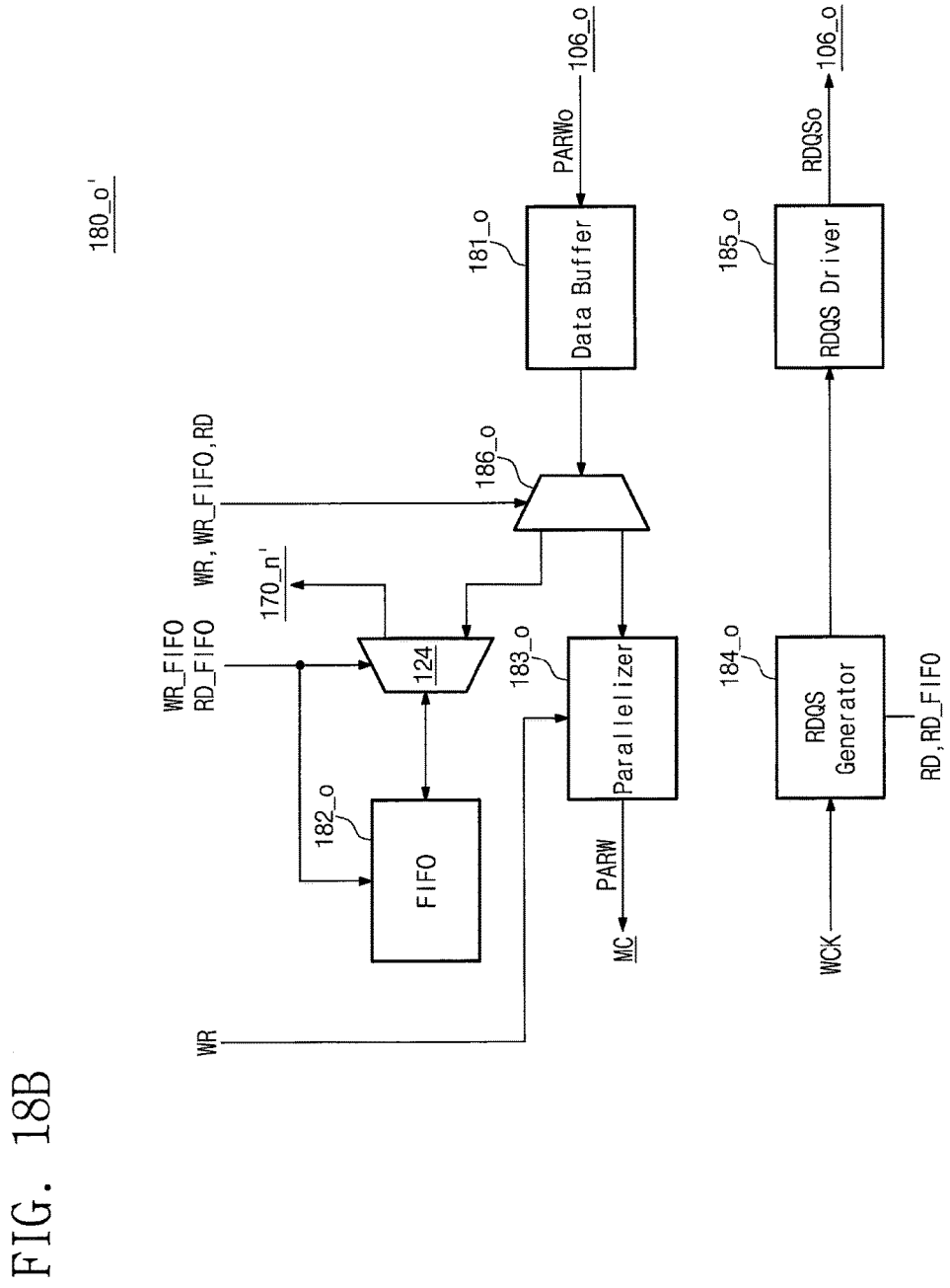
FIG. 18B illustrates an application of one of the data delivery, clock generation, and training blocks according to embodiments of the inventive concepts.

FIG. 18B illustrates an application of one of the data delivery, clock generation and training blocks 180_0 and 180_1 according to embodiments of the inventive concepts. Referring to FIGS. 3 and 18B, a data delivery, clock generation and training block 180_*o*' includes the data buffer 181_*o*, the FIFO register 182_*o*, the parallelizer 183_*o*, the read data strobe signal generator 184_*o*, the read data strobe signal driver 185_*o*, and an encoder 186_*o*.

In response to a write command WR from the control logic 190, the encoder 186_*o* may connect the data buffer 181_*o* with the parallelizer 183_*o*. In response to a FIFO register write command WR_FIFO, the encoder 186_*o* may transmit an output of the data buffer 181_*o* to the fourth encoder 124. The parallelizer 183_*o* may parallelize a write parity signal PARWo to a write parity PARW depending on the write command WR.

When the FIFO register read command RD_FIFO has a first option, the FIFO register 182_*o* may not operate. As another example, the FIFO register 182_*o* may output stored training data, and the fourth encoder 124 may block the training data output from the FIFO register 182_*o*.

When the FIFO register read command RD_FIFO has a second option, the FIFO register 182_*o* may output stored training data. The fourth encoder 124 may transmit training data output from the FIFO register 182_*o* to a data delivery and training block of the first block 160 associated with the redirector 120 or the data delivery and training block 170_*n*' of the second block 170.

In some embodiments, in the detailed description, the data delivery, clock generation and training block 180_*o* of FIG. 18A and the data delivery, clock generation and training block 180_*o*' of FIG. 18B may be interchangeably used.

As described with reference to FIGS. 16A to 18B, the third block 180*a* may store training data received through the sixth memory pads 106_0 and 106_1 in a FIFO register in response to the FIFO register write command WR_FIFO. The third block 180*a* may transmit the stored training data to the first block 160 or the second block 170 depending on the FIFO register read command RD_FIFO.

The first block 160 or the second block 170 may output the training data transmitted from the third block 180*a*. That is, training data received in the third block 180*a* through the sixth memory pads 106_0 and 106_1 may be output to the outside after being redirected to the first block 160 or the second block 170. Accordingly, write training may be performed on the sixth memory pads 106_0 and 106_1.

Figure 19:
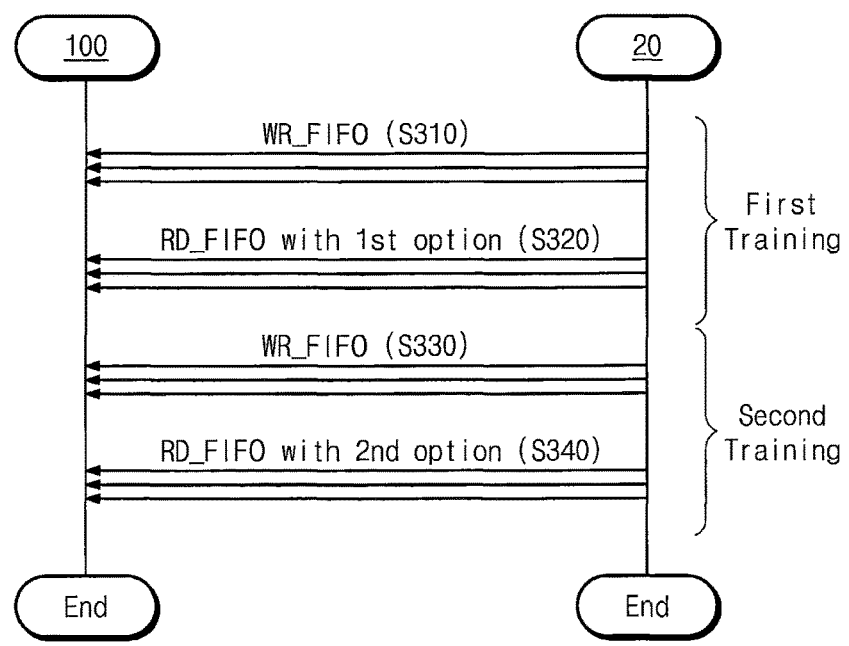
FIG. 19 is a flowchart illustrating a write training method according to embodiments of the inventive concepts.

FIG. 19 is a flowchart illustrating a write training method according to embodiments of the inventive concepts. Referring to FIGS. 1, 3, and 16A to 19, in operation S310, the controller 20 may transmit the FIFO register write command WR_FIFO to the semiconductor memory 100. The controller 20 may transmit first training data to the semiconductor memory 100 together with the FIFO register write command WR_FIFO.

For example, the first training data may be transmitted through the fourth memory pads 104_0 to 104_15 and the fifth memory pads 105_0 and 105_1. The semiconductor memory 100 may store the first training data in the FIFO registers 172_*m* and 172_*n* in response to the FIFO register write command WR_FIFO.

In operation S320, the controller 20 may transmit the FIFO register read command RD_FIFO having a first option to the semiconductor memory 100. In response to the FIFO register read command RD_FIFO, the semiconductor memory 100 may output the data stored in the FIFO registers 172_m and/or 172_n as second training data to the controller 20. The second training data may be transmitted through the fourth memory pads 104_0 to 104_15 and the fifth memory pads 105_0 and 105_1.

Operation S310 and operation S320 may constitute a first training operation targeted for pads that are not obstructed to output training data. Afterwards, in operation S330 and operation S340, a second training operation may be performed on pads that are obstructed to output training data. The second training operation may be redirected training in which an input pad and an output pad of training data are redirected.

In operation S330, the controller 20 may transmit the FIFO register write command WR_FIFO to the semiconductor memory 100. The controller 20 may transmit third training data to the semiconductor memory 100 together with the FIFO register write command WR_FIFO. For example, the third training data may be transmitted to the semiconductor memory 100 through the sixth memory pads 106_0 and 106_1. The semiconductor memory 100 may store the third training data in the FIFO register 182_o in response to the FIFO register write command WR_FIFO.

In operation S340, the controller 20 may transmit the FIFO register read command RD_FIFO having a second option to the semiconductor memory 100. In response to the FIFO register read command RD_FIFO having the second option, at least one of the first data delivery and training blocks 160_0 to 160_15 or at least one of the second data delivery and training blocks 170_0 and 170_1 of the second block 170 may output the third training data stored in the FIFO register 182_o of the third block 180a to the controller 20 as fourth training data. The fourth training data may be output through at least one of the fourth memory pads 104_0 to 104_15 or at least one of the fifth memory pads 105_0 and 105_1.

FIG. 20 illustrates an example of command and address signals CA0 to CA6 of the FIFO register write command WR_FIFO. Referring to FIGS. 11 and 20, at a rising edge "R" of the clock signal CK_t when the chip select signal CS has the high level "H," the command and address signals CA0 to CA6 of the FIFO register write command WR_FIFO may sequentially have the low level "L," the low level "L," the low level "L," the low level "L," the low level "L," the high level "H," and the low level "L."

At a falling edge "F" of the clock signal CK_t regardless of a level of the chip select signal CS ("X"), the command and address signals CA0 to CA6 of the FIFO register write command WR_FIFO may have a valid value "V" corresponding to any one of a high level and a low level. For example, the FIFO register write command WR_FIFO that does not have an option may not be associated with a falling edge of the clock signal CK_t.

FIG. 21 illustrates an example of command and address signals CA0 to CA6 of the FIFO register read command RD_FIFO. Referring to FIGS. 8 and 21, an option of the FIFO register read command RD_FIFO may be determined according to whether the command and address signals CA0 to CA6 have any values at a falling edge "F" of the clock signal CK_t after the chip select signal CS has a high level "H."

For example, at a rising edge "R" of the clock signal CK_t when the chip select signal CS has the high level "H," the command and address signals CA0 to CA6 of the FIFO register read command RD_FIFO may sequentially have the low level "L," the low level "L," the low level "L," the low level "L," the low level "L," the high level "H," and the high level "H."

At a falling edge "F" of the clock signal CK_t regardless of a level of the chip select signal CS ("X"), the command and address signal CA0 of the FIFO register write command WR_FIFO having a first option has the low level "L." The remaining command and address signals CA1 to CA6 may have a valid level "V" corresponding to any one of a high level and a low level.

At the falling edge "F" of the clock signal CK_t regardless of a level of the chip select signal CS ("X"), the command and address signal CA0 of the FIFO register read command RD_FIFO having a second option has the high level "H." The remaining command and address signals CA1 to CA6 may have a valid level "V" corresponding to any one of a high level and a low level.

As described with reference to FIG. 21, an option of the FIFO register read command RD_FIFO is selected according to whether the command and address signal CA0 has the high level "H" or the low level "L" at the falling edge "F" of the clock signal CK_t. Since an additional cycle of the clock signal CK_t or an additional pad is unnecessary, the overhead due to options of the FIFO register write command WR_FIFO is suppressed.

In some embodiments, a flow of first training data according to the FIFO register write command WR_FIFO may be the same as illustrated in FIG. 10. A flow of second training data according to the FIFO register read command RD_FIFO having a first option may be the same as illustrated in FIG. 13.

A flow of third training data according to the FIFO register write command WR_FIFO may be the same as illustrated in FIG. 14. A flow of fourth training data according to the FIFO register read command RD_FIFO having a second option may be the same as illustrated in FIG. 15.

Figure 22:
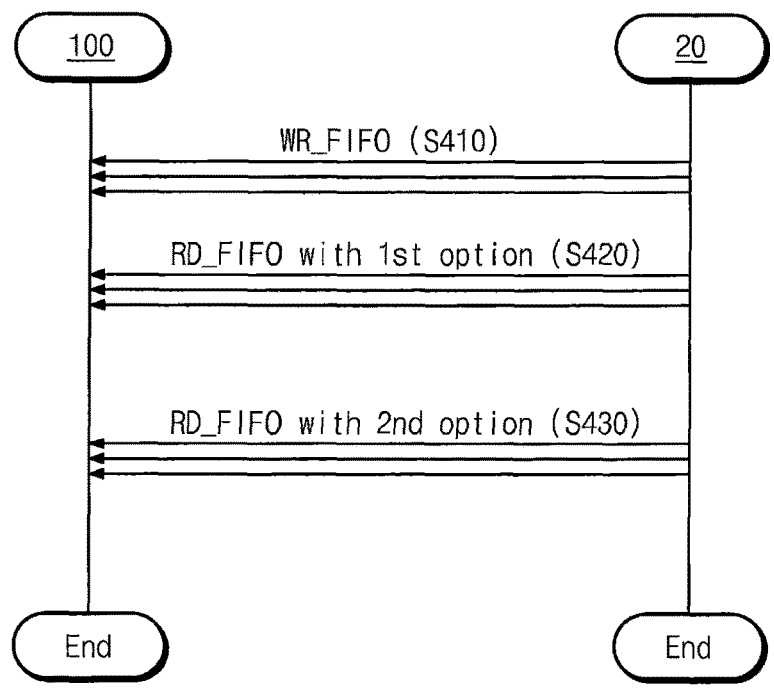
FIG. 22 is a flowchart illustrating a write training method according to embodiments of the inventive concepts.

FIG. 22 is a flowchart illustrating a write training method according to embodiments of the inventive concept. Referring to FIGS. 1, 3, 16A to 18b, and 22, in operation S410, the controller 20 may transmit the FIFO register write command WR_FIFO to the semiconductor memory 100. The controller 20 may transmit first training data to the semiconductor memory 100 together with the FIFO register write command WR_FIFO.

For example, the first training data may be transmitted through the fourth memory pads 104_0 to 104_15, the fifth memory pads 105_0 and 105_1, and the sixth memory pads 106_0 and 106_1. The semiconductor memory 100 may store the first training data in the FIFO registers 172_m, 172_n, and/or 182_o in response to the FIFO register write command WR_FIFO.

In operation S420, the controller 20 may transmit the FIFO register read command RD_FIFO having a first option to the semiconductor memory 100. Depending on the FIFO register read command RD_FIFO, the semiconductor memory 100 may output partial data, which correspond to the fourth memory pads 104_0 to 104_15 and the fifth memory pads 105_0 and 105_1, from among the stored first training data to the controller 20 as second training data. The second training data may be transmitted through the fourth memory pads 104_0 to 104_15 and the fifth memory pads 105_0 and 105_1.

In operation S430, the controller 20 may transmit the FIFO register read command RD_FIFO having a second option to the semiconductor memory 100. In response to the FIFO register read command RD_FIFO having the second option, at least one of the first data delivery and training blocks 160_0 to 160_15 or at least one of the second data delivery and training blocks 170_0 and 170_1 of the second block 170 may output the remaining partial data of the first training data stored in the FIFO register 182_o of the third block 180a to the controller 20 as fourth training data.

The fourth training data may be output through at least one of the fourth memory pads 104_0 to 104_15 or at least one of the fifth memory pads 105_0 and 105_1. That is, according to a third embodiment illustrated in FIG. 22, the first training data and the third training data may be transmitted to the semiconductor memory 100 at the same time.

Figure 23:
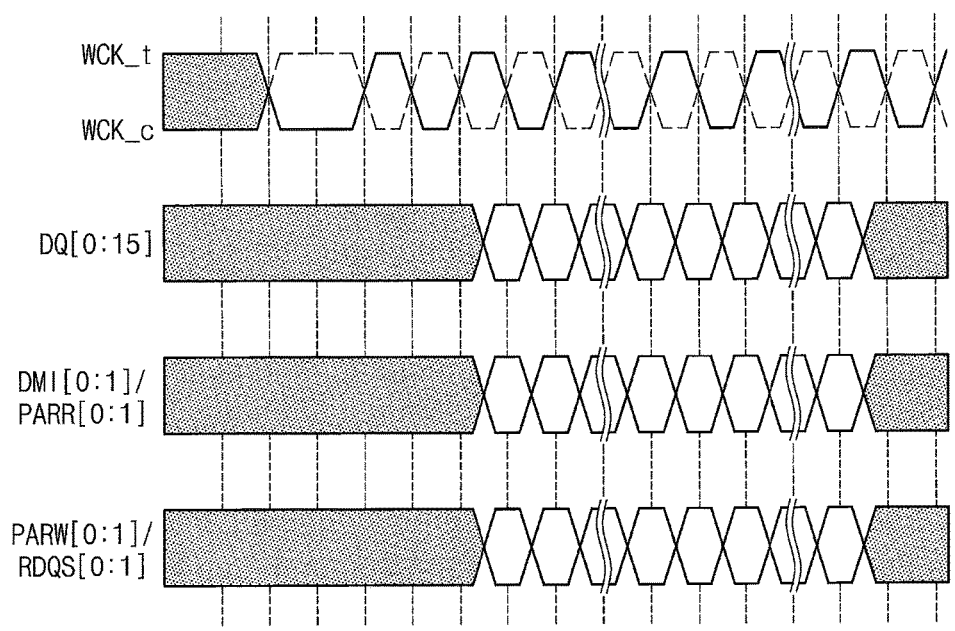
FIG. 23 illustrates an example in which first training data and third training data are transmitted to the semiconductor memory depending on a FIFO register write command.

FIG. 23 illustrates an example in which first training data and third training data are transmitted to the semiconductor memory 100 depending on the FIFO register write command WR_FIFO. In FIG. 23, "WCK_t" indicates one of the write clock signals WCK[0:1], and "WCK_c" indicates an inverted version of the write clock signal WCK_t.

Referring to FIGS. 1, 3, 11, and 23, the controller 20 may transmit first and third training data to the semiconductor memory 100 when a specific time elapses after transmitting the FIFO register write command WR_FIFO. The controller 20 may transmit a part of the first training data to the semiconductor memory 100 through the fourth memory pads 104_0 to 104_15 as the data signals DQ[0:15] in synchronization with a rising edge and a falling edge of the write clock signal WCK_t.

The controller 20 may transmit the remaining part of the first training data to the semiconductor memory 100 through the fifth memory pads 105_0 and 105_1 as the data mask inversion signals DMI[0:1] in synchronization with the rising edge and the falling edge of the write clock signal WCK_t. The controller 20 may transmit the third training data to the semiconductor memory 100 through the sixth memory pads 106_0 and 106_1 as the write parity signals PARW[0:1] in synchronization with a rising edge and a falling edge of the write clock signal WCK_t.

In some embodiments, a flow of second training data according to the FIFO register read command RD_FIFO having a first option may be the same as illustrated in FIG. 13. A flow of fourth training data according to the FIFO register read command RD_FIFO having a second option may be the same as illustrated in FIG. 15.

Figure 24:
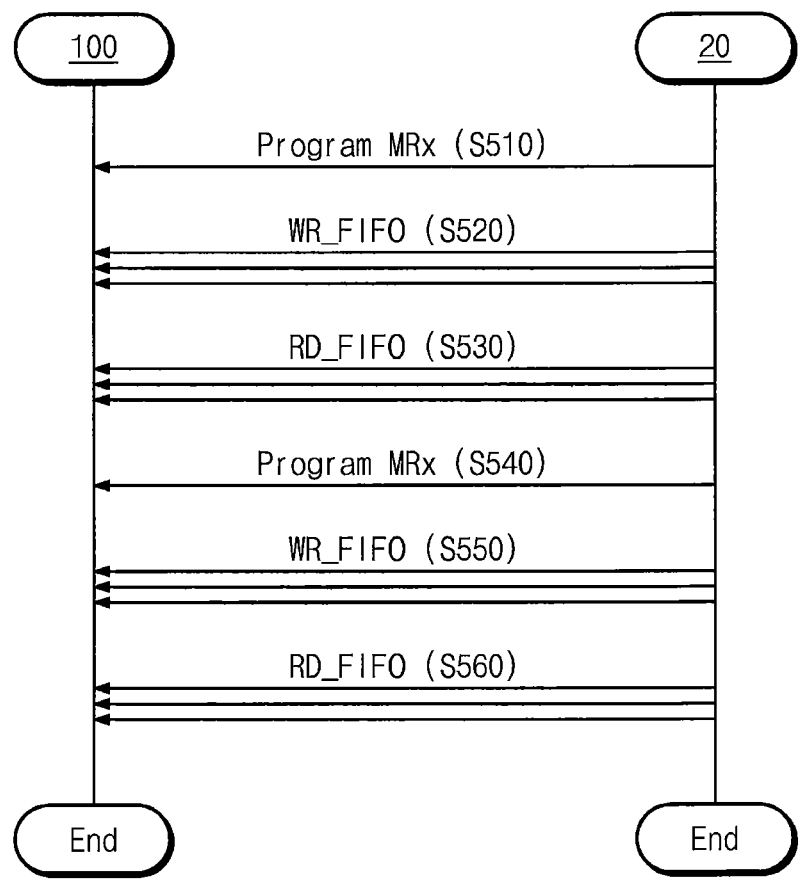
FIG. 24 is a flowchart illustrating a write training method according to embodiments of the inventive concepts.

FIG. 24 is a flowchart illustrating a write training method according to embodiments of the inventive concepts. Referring to FIGS. 1, 3, and 24, in operation S510, the controller 20 may program the mode register 110 of the semiconductor memory 100. For example, the controller 20 may program the mode register 110 such that an option of the FIFO register write command WR_FIFO or an option of the FIFO register read command RD_FIFO is set to a first option. Afterwards, training is performed according to the programmed option.

In operation S520, the controller 20 may transmit the FIFO register write command WR_FIFO to the semiconductor memory 100. Depending on the FIFO register write command WR_FIFO, the controller 20 may transmit first training data to the semiconductor memory 100. The first training data may be transmitted through the fourth memory pads 104_0 to 104_15 and the fifth memory pads 105_0 and 105_1 as described with reference to FIG. 10.

In operation S530, the controller 20 may transmit the FIFO register read command RD_FIFO to the semiconductor memory 100. Depending on the FIFO register read command RD_FIFO, the semiconductor memory 100 may transmit second training data to the controller 20. The second training data may be transmitted through the fourth memory pads 104_0 to 104_15 and the fifth memory pads 105_0 and 105_1 as described with reference to FIG. 13.

In operation S540, the controller 20 may program the mode register 110 of the semiconductor memory 100. For example, the controller 20 may program the mode register 110 such that an option of the FIFO register write command WR_FIFO or an option of the FIFO register read command RD_FIFO is set to a second option. Afterwards, training continues depending on the programmed option.

In operation S550, the controller 20 may transmit the FIFO register write command WR_FIFO to the semiconductor memory 100. Depending on the FIFO register write command WR_FIFO, the controller 20 may transmit third training data to the semiconductor memory 100. The third training data may be transmitted through the sixth memory pads 106_0 and 106_1 as described with reference to FIG. 14.

In operation S560, the controller 20 may transmit the FIFO register read command RD_FIFO to the semiconductor memory 100. Depending on the FIFO register read command RD_FIFO, the semiconductor memory 100 may transmit fourth training data to the controller 20. The fourth training data may be transmitted through at least one pad selected from the fourth memory pads 104_0 to 104_15 and the fifth memory pads 105_0 and 105_1 as described with reference to FIG. 15.

Figure 25:
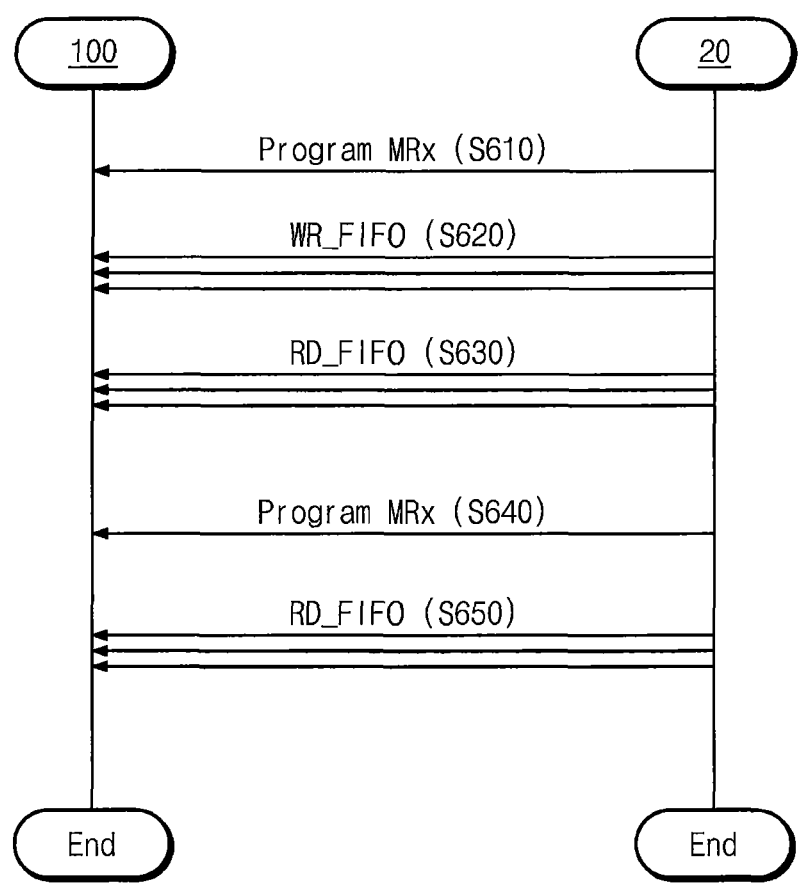
FIG. 25 is a flowchart illustrating a write training method according to embodiments of the inventive concepts.

FIG. 25 is a flowchart illustrating a write training method according to embodiments of the inventive concepts. Referring to FIGS. 1, 3, and 25, in operation S610, the controller 20 may program the mode register 110 of the semiconductor memory 100. For example, the controller 20 may program the mode register 110 such that an option of the FIFO register read command RD_FIFO is set to a first option.

In operation S620, the controller 20 may transmit the FIFO register write command WR_FIFO to the semiconductor memory 100. Depending on the FIFO register write command WR_FIFO, the controller 20 may transmit first training data to the semiconductor memory 100. The first training data may be transmitted through the fourth memory pads 104_0 to 104_15, the fifth memory pads 105_0 and 105_1, and the sixth memory pads 106_0 and 106_1 as described with reference to FIG. 23.

In operation S630, the controller 20 may transmit the FIFO register read command RD_FIFO to the semiconductor memory 100. Depending on the FIFO register read command RD_FIFO, the semiconductor memory 100 may transmit second training data to the controller 20. The second training data may be transmitted through the fourth memory pads 104_0 to 104_15 and the fifth memory pads 105_0 and 105_1 as described with reference to FIG. 13.

In operation S640, the controller 20 may program the mode register 110 of the semiconductor memory 100. For example, the controller 20 may program the mode register 110 such that an option of the FIFO register read command RD_FIFO is set to a second option. Training continues depending on the programmed option.

In operation S650, the controller 20 may transmit the FIFO register read command RD_FIFO to the semiconductor memory 100. Depending on the FIFO register read command RD_FIFO, the semiconductor memory 100 may transmit fourth training data to the controller 20. The fourth training data may be transmitted through at least one pad selected from the fourth memory pads 104_0 to 104_15 and the fifth memory pads 105_0 and 105_1 as described with reference to FIG. 15.

Figure 26A:
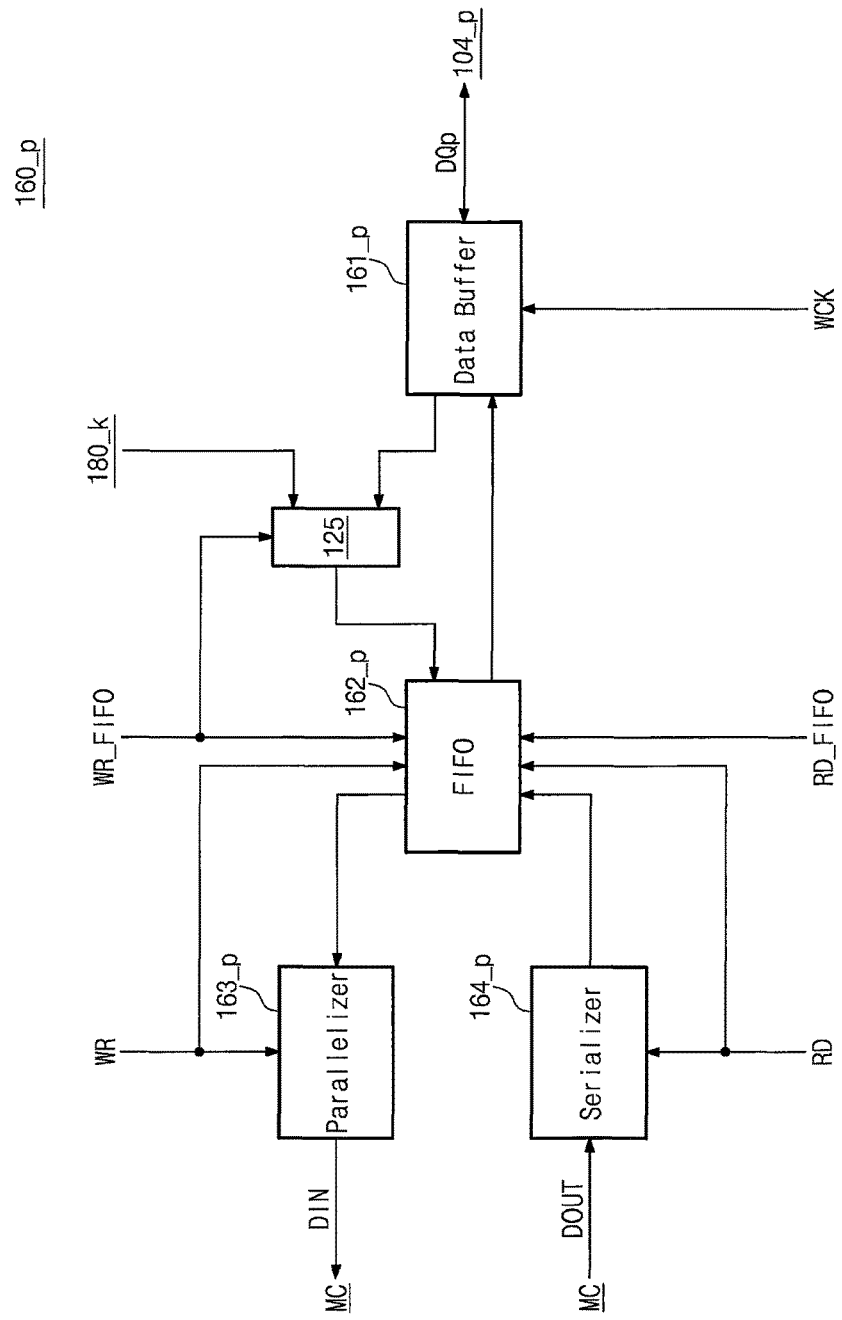
FIG. 26A illustrates another example of one of the first data delivery and training blocks according to embodiments of the inventive concepts.

FIG. 26A illustrates another example of one of the first data delivery and training blocks 160_0 to 160_15 according to embodiments of the inventive concepts. In some embodiments, an example of a first data delivery and training block 160_p that is associated with the redirector 120 is illustrated in FIG. 26A. Referring to FIGS. 3 and 26A, the first data delivery and training block 160_p includes a data buffer 161_p, a first-in first-out (FIFO) register 162_p, a parallelizer 163_p, and a serializer 164_p.

In a normal operation (e.g., not training), the data buffer 161_p may communicate a data signal DQp with a fourth memory pad 104_p. In training, the data buffer 161_p may communicate training data with the fourth memory pad 104_p.

The data buffer 161_p, the FIFO register 162_p, the parallelizer 163_p, and the serializer 164_p operate in the same manner as described with reference to FIG. 5A, and thus, a description thereof will not be repeated here.

In some embodiments, the first data delivery and training block 160_p may complete training together with the data delivery, clock generation and training block 180_k(refer to FIG. 6A) depending on one FIFO register write command WR_FIFO and one FIFO register read command RD_FIFO.

In training, when transmitting the FIFO register write command WR_FIFO, the controller 20 may transmit training data to the fourth memory pads 104_0 to 104_15, the fifth memory pads 105_0 and 105_1, and the sixth memory pads 106_0 to 106_3. That is, the controller 20 may transmit training data to all pads used for training.

If the FIFO register write command WR_FIFO is received, the data delivery, clock generation and training block 180_k may output training data (e.g., first combination training data) to a fifth encoder 125. Also, the data buffer 161_p may output training data (e.g., second combination training data) received through the fourth memory pad 104_p to the fifth encoder 125.

If the FIFO register write command WR_FIFO is received, the fifth encoder 125 may perform encoding on the pieces of first and second combination training data. For example, the fifth encoder 125 may perform an XOR operation on the pieces of first and second combination training data. The fifth encoder 125 may store the encoding result (e.g., third combination data) in the FIFO register 162_p.

If the FIFO register read command RD_FIFO is received, the FIFO register 162_p may output the stored data as fourth combination data to the data buffer 161_p. The data buffer 161_p may transmit the fourth combination data through the fourth memory pad 104_p.

That is, the first data delivery and training blocks 160_0 to 160_15, the second data delivery and training blocks 170_0 and 170_1, and the data delivery, clock generation and training blocks 180_0 and 180_1 may perform (or complete) training depending on one FIFO register write command WR_FIFO free from an option (i.e., without, or regardless of, a first or second option as described herein) and one FIFO register read command RD_FIFO free from an option (i.e., without, or regardless of, a first or second option as described herein).

Figure 26B:
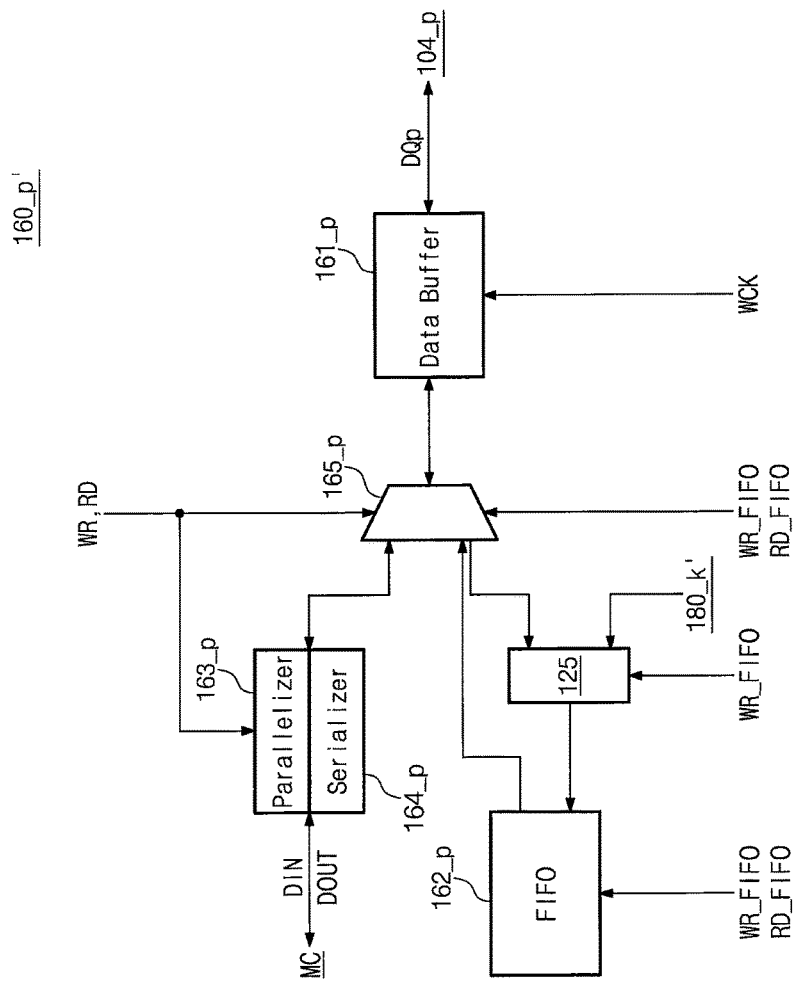
FIG. 26B illustrates an application of another of the first data delivery and training blocks, which is illustrated in FIG. 25A.

FIG. 26B illustrates an application of another of the first data delivery and training blocks 160_0 to 160_15, which is illustrated in FIG. 25A. In some embodiments, an example of a first data delivery and training block 160_p' that is associated with the redirector 120 is illustrated in FIG. 26B. Referring to FIGS. 3 and 26B, the first data delivery and training block 160_p' includes the data buffer 161_p, the FIFO register 162_p, the parallelizer 163_p, the serializer 164_p, and an encoder 165_p.

In response to a write command WR or a read command RD from the control logic 190, the encoder 165_p may connect the parallelizer 163_p and the serializer 164_p with the data buffer 161_p. In response to the FIFO register write command WR_FIFO or the FIFO register read command RD_FIFO, the encoder 165_p may connect an output of the FIFO register 162_p with the data buffer 161_p and may connect an output of the data buffer 161_p with the fifth encoder 125.

The parallelizer 163_p may parallelize a data signal DQp to the input data DIN depending on the write command WR. The serializer 164_p may serialize the output data DOUT to the data signal DQp depending on the read command RD.

If the FIFO register write command WR_FIFO is received, the data delivery, clock generation and training block 180_k' (refer to FIG. 6B) may output training data (e.g., first combination training data) to the fifth encoder 125. Also, the data buffer 161_p may output training data (e.g., second combination training data) received through the fourth memory pad 104_p as the data signal DQp to the fifth encoder 125.

If the FIFO register write command WR_FIFO is received, the fifth encoder 125 may perform encoding on the pieces of first and second combination training data. For example, the fifth encoder 125 may perform an XOR operation on the pieces of first and second combination training data. The fifth encoder 125 may store the encoding result (e.g., third combination data) in the FIFO register 162_p.

If the FIFO register read command RD_FIFO is received, the FIFO register 162_p may output the stored data as fourth combination data to the data buffer 161_p. The data buffer 161_p may transmit the fourth combination data as the data signal DQp through the fourth memory pad 104_p.

Figure 27A:
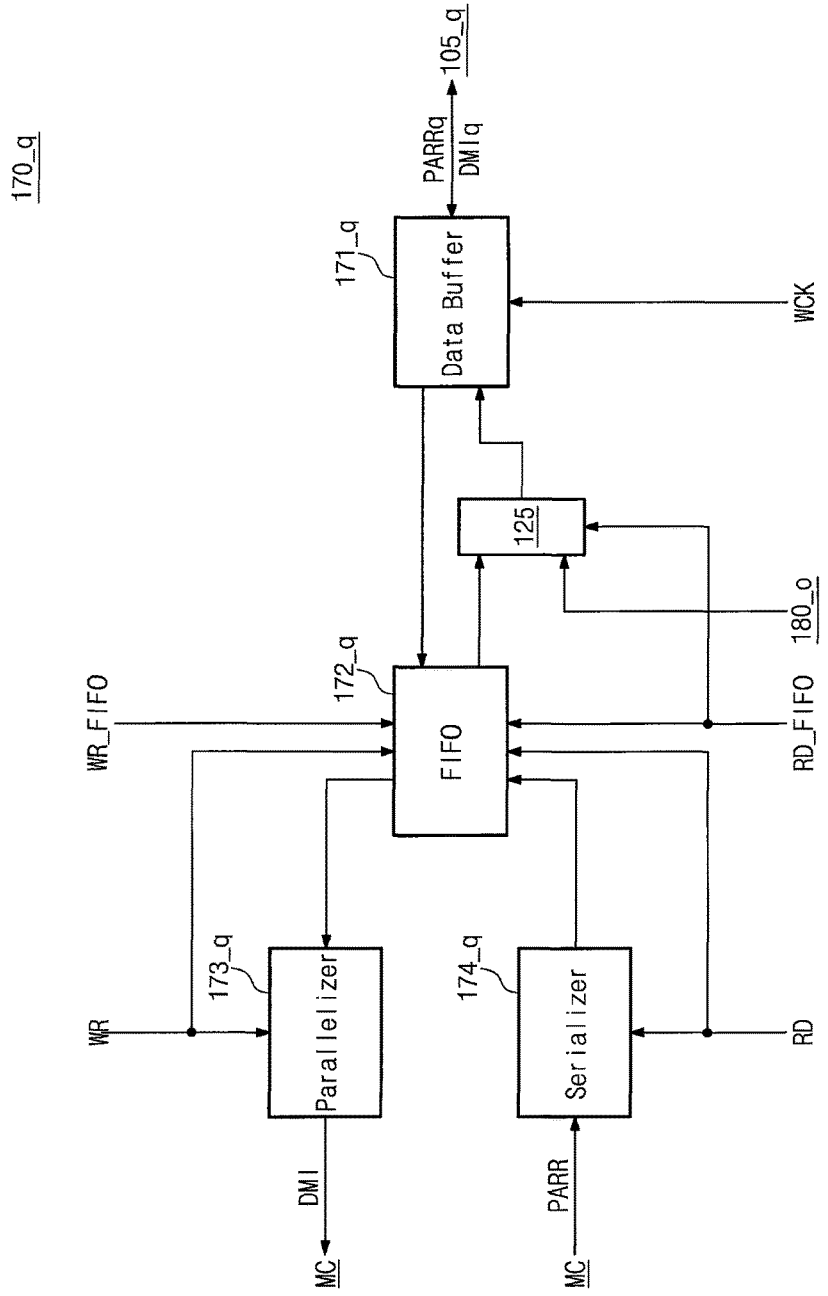
FIG. 27A illustrates an example of one of the second data delivery and training blocks according to embodiments of the inventive concepts.

FIG. 27A illustrates an example of one of the second data delivery and training blocks 170_0 and 170_1 according to embodiments of the inventive concepts. In some embodiments, an example of a second data delivery and training block 170_q that is associated with the redirector 120 is illustrated in FIG. 27A. Referring to FIGS. 3 and 27A, the second data delivery and training block 170_q includes a data buffer 171_q, a first-in first-out (FIFO) register 172_q, a parallelizer 173_q, and a serializer 174_q.

In a normal operation (e.g., not training), the data buffer 171_q may communicate a read parity signal PARRq and a data mask inversion signal DMIq with a fifth memory pad 105_q. In training, the data buffer 171_q may communicate training data with the fifth memory pad 105_q.

The data buffer 171_q, the FIFO register 172_q, the parallelizer 173_q, and the serializer 174_q operate in the same manner as described with reference to FIG. 4A, and thus, a description thereof will not be repeated here.

In some embodiments, the second data delivery and training block 170_q may complete training together with the data delivery, clock generation and training block 180_o (refer to FIG. 18A) depending on one FIFO register write command WR_FIFO and one FIFO register read command RD_FIFO.

When transmitting the FIFO register write command WR_FIFO, the controller 20 may transmit training data to the fourth memory pads 104_0 to 104_15, the fifth memory pads 105_0 and 105_1, and the sixth memory pads 106_0 to 106_3. That is, the controller 20 may transmit training data to all pads used for training.

If the FIFO register write command WR_FIFO is received, the data delivery, clock generation and training block 180_o may store training data (e.g., first combination training data) in the FIFO register 182_o. Also, the data buffer 171_q may store training data (e.g., second combination training data) received through the fifth memory pad 105_q in the FIFO register 172_q.

If the FIFO register read command RD_FIFO is received, the data delivery, clock generation and training block 180_o may output the first combination training data to the fifth encoder 125. The FIFO register 172_q may output second combination training data to the fifth encoder 125.

The fifth encoder 125 may perform encoding on the pieces of first and second combination training data. For example, the fifth encoder 125 may perform an XOR operation on the pieces of first and second combination training data. The fifth encoder 125 may output the encoding result (e.g., third combination data) to the fifth memory pad 105_q through the data buffer 171_q.

That is, the first data delivery and training blocks 160_0 to 160_15, the second data delivery and training blocks 170_0 and 170_1, and the data delivery, clock generation and training blocks 180_0 and 180_1 may perform (or complete) training depending on one FIFO register write command WR_FIFO free from an option (i.e., without, or regardless of, a first or second option as described herein) and one FIFO register read command RD_FIFO free from an option (i.e., without, or regardless of, a first or second option as described herein).

Figure 27B:
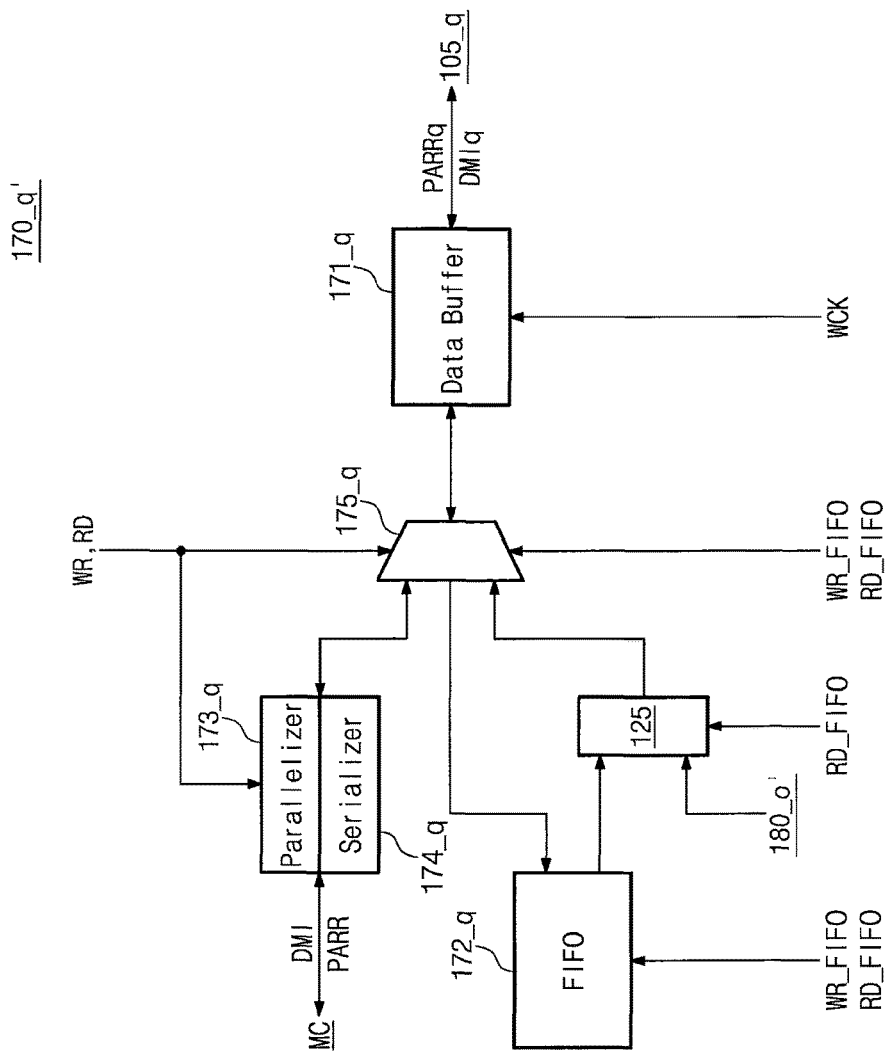
FIG. 27B illustrates an example of one of the second data delivery and training blocks according to embodiments of the inventive concepts.

FIG. 27B illustrates an example of one of the second data delivery and training blocks 170_0 and 170_1 according to embodiments of the inventive concept. In some embodiments, an example of a second data delivery and training block 170_q' that is associated with the redirector 120 is illustrated in FIG. 27B. Referring to FIGS. 3 and 27B, the second data delivery and training block 170_q' includes the data buffer 171_q, the FIFO register 172_q, the parallelizer 173_q, the serializer 174_q, and an encoder 175_q.

In response to a write command WR or a read command RD from the control logic 190, the encoder 175_q may connect the parallelizer 173_q and the serializer 174_q with the data buffer 171_q. In response to the FIFO register write command WR_FIFO or the FIFO register read command RD_FIFO, the encoder 175_q may connect an output of the data buffer 171_q with the FIFO register 172_q and may transmit training data transmitted through the fifth encoder 125 to the data buffer 171_q.

The parallelizer 173_q may parallelize a data mask inversion signal DMIq to the data mask inversion signal DMI depending on the write command WR. The serializer 174_q may serialize a read parity PARR to a read parity signal PARRq depending on the read command RD.

If the FIFO register write command WR_FIFO is received, the data delivery, clock generation and training block 180_o' (refer to FIG. 18B) may store training data (e.g., first combination training data) in the FIFO register 182_o. Also, the data buffer 171_q may store training data (e.g., second combination training data) received through the fifth memory pad 105_q in the FIFO register 172_q.

If the FIFO register read command RD_FIFO is received, the data delivery, clock generation and training block 180_o' may output the first combination training data to the fifth encoder 125. The FIFO register 172_q may output second combination training data to the fifth encoder 125.

The fifth encoder 125 may perform encoding on the pieces of first and second combination training data. For example, the fifth encoder 125 may perform an XOR operation on the pieces of first and second combination training data. The fifth encoder 125 may output the encoding result (e.g., third combination data) to the fifth memory pad 105_q through the data buffer 171_q.

As described above, according to embodiments of the inventive concepts, it is possible to perform write training on a pad that is specified not to transmit data in reading and is specified to transmit data in writing. Accordingly, a semiconductor memory with improved reliability, a memory system including the semiconductor memory, and an operating method of the semiconductor memory are provided.

In the above-described embodiments, components according to embodiments of the inventive concept are referenced by using the terms "block," "engine," "logic," and the like. The "block," "engine," or "logic" may be implemented with various hardware devices, such as an integrated circuit (IC), an application specific IC (ASIC), a field programmable gate array (FPGA), and a complex programmable logic device (CPLD), firmware driven in hardware devices, software such as an application, or a combination of a hardware device and software. Also, "block," "engine," or "logic" may include circuits or intellectual property (IP) implemented with semiconductor devices.

According to the inventive concept, a read data strobe signal and write parity data are conveyed through the same pad, and training is performed on a write parity by using other pads. Accordingly, the reliability of a semiconductor memory is improved by apply a read data strobe signal and write parity data to the semiconductor memory without increasing the number of pads.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A semiconductor memory device comprising:
   a memory core configured to perform reading and writing of data;
   data delivery and training blocks connected between first pads and the memory core; and
   at least one data delivery, clock generation and training block connected between at least one second pad and the memory core,
   wherein, in a first training operation, the data delivery and training blocks output first training data, which are received through the first pads, through the first pads as second training data,
   wherein, in a second training operation, at least one of the data delivery and training blocks outputs third training data, which are received through the at least one second pad, through at least one of the first pads as fourth training data, and
   wherein the second training data and the fourth training data are output in synchronization with read data strobe signals output through the at least one second pad.

2. The semiconductor memory device of claim 1, wherein each of the data delivery and training blocks includes a first first-in first-out (FIFO) register,
   wherein the at least one data delivery, clock generation and training block includes a second FIFO register, and
   wherein the first training operation and the second training operation are performed according to a FIFO register write command and a FIFO register read command.

3. The semiconductor memory device of claim 2, wherein, in the first training operation, the data delivery and training blocks store the first training data received from the first pads in respective first FIFO registers of the data delivery and training blocks responsive to the FIFO register write command, and
   wherein, in the first training operation, the data delivery and training blocks output the first training data stored in the first FIFO registers through the first pads as the second training data responsive to the FIFO register read command.

4. The semiconductor memory device of claim 2, wherein, in the second training operation, the at least one of the data delivery and training blocks stores the third training data received from the at least one second pad in at least one first FIFO register of the at least one of the data delivery and training blocks responsive to the FIFO register write command, and
   wherein, in the second training operation, the at least one of the data delivery and training blocks outputs the third training data stored in the at least one first FIFO register through the at least one of the first pads as the fourth training data responsive to the FIFO register read command.

5. The semiconductor memory device of claim 2, wherein the FIFO register write command comprises different respective options in the first training operation and the second training operation.

6. The semiconductor memory device of claim 2, wherein, in the second training operation, the at least one data delivery, clock generation and training block stores the third training data received from the at least one second pad in the second FIFO register responsive to the FIFO register write command, and
   wherein, in the second training operation, the at least one of the data delivery and training blocks outputs the third training data stored in the second FIFO register through the at least one of the first pads as the fourth training data responsive to the FIFO register read command.

7. The semiconductor memory device of claim 2, wherein, in the first training operation, the at least one data delivery, clock generation and training block stores the third training data received from the at least one second pad in the second FIFO register responsive to the FIFO register write command, and
   wherein, in the second training operation, the at least one of the data delivery and training blocks outputs the third training data stored in the second FIFO register through at least one of the first pads as the fourth training data responsive to the FIFO register read command.

8. The semiconductor memory device of claim 2, wherein the FIFO register read command comprises different respective options in the first training operation and the second training operation.

9. The semiconductor memory device of claim 2, wherein the memory core includes a mode register, and
   wherein the first training operation is selected responsive to the mode register being programmed to have a first option and the second training operation is selected responsive to the mode register being programmed to have a second option.

10. The semiconductor memory device of claim 1, wherein first data delivery and training blocks of the data delivery and training blocks transmit data bits, which are to be written in the memory core or are read from the memory core, between a first one of the first pads and the memory core.

11. The semiconductor memory device of claim 10, wherein the data bits include a data portion and a parity portion for the data portion.

12. The semiconductor memory device of claim 10, wherein the at least one data delivery, clock generation and training block transmits a write parity transmitted from the at least one second pad to the memory core and outputs at least one read data strobe signal through the at least one second pad.

13. The semiconductor memory device of claim 10, wherein second data delivery and training blocks of the data delivery and training blocks transmit data mask inversion signals, which are transmitted from a second one of the first pads, to the memory core and output a read parity transmitted from the memory core to the second one of the first pads.

14. The semiconductor memory device of claim 1, further comprising:
at least one clock generation block connected to at least one third pad,
wherein the second training data and the fourth training data are output in synchronization with a second read data strobe signal output through the at least one third pad.

15. A memory system comprising:
a semiconductor memory; and
a controller configured to control the semiconductor memory,
wherein the semiconductor memory and the controller communicate with each other through data input and output lines, data mask inversion lines, and read data strobe lines,
wherein, in a first training operation, the controller transmits first data to the semiconductor memory through the data input and output lines and the data mask inversion lines and reads the first data from the semiconductor memory through the data input and output lines and the data mask inversion lines, and
wherein, in a second training operation, the controller transmits second data to the semiconductor memory through the read data strobe lines and reads the second data from the semiconductor memory through at least two of the data input and output lines and the data mask inversion lines.

16. The memory system of claim 15, wherein the semiconductor memory outputs read data strobe signals through the read data strobe lines and outputs the first data and the second data through the data input and output lines and the data mask inversion lines in synchronization with the read data strobe signals.

17. The memory system of claim 16, wherein the controller transmits a clock signal to the semiconductor memory through a clock line and transmits a write clock signal to the semiconductor memory through a write clock line, and
wherein the semiconductor memory adjusts the write clock signal to output the read data strobe signals.

18. The memory system of claim 15, wherein the controller selects one of the first training operation or the second training operation responsive to one of receiving a FIFO register write command, receiving a FIFO register read command, and a programming of a mode register.

19. A semiconductor memory device comprising:
a memory core configured to perform reading and writing of data;
a first data delivery and training block connected between a first pad and the memory core;
a second data delivery and training block connected between a second pad and the memory core; and
a data delivery, clock generation and training block connected between a third pad and the memory core,
wherein, in a training input operation, the first and second data delivery and training blocks receive first and second training data through the first pad and the second pad, respectively, and the data delivery, clock generation and training block receives third training data through the third pad,
wherein, in a training output operation, the first data delivery and training block outputs the first training data through the first pad, and the second data delivery and training block combines the second and third training data to generate fourth training data and outputs the fourth training data through the second pad.

20. The semiconductor memory device of claim 19, wherein, in the training output operation, the data delivery, clock generation and training block outputs a read data strobe signal through the third pad, and
wherein the first and second data delivery and training blocks respectively output the first and fourth training data in synchronization with the read data strobe signal.

* * * * *